US009948400B2

(12) United States Patent
Yuda

(10) Patent No.: US 9,948,400 B2
(45) Date of Patent: Apr. 17, 2018

(54) DRIVE CIRCUIT AND OPTICAL NETWORK UNIT

(71) Applicant: SUMITOMO ELECTRIC INDUSTRIES, LTD., Osaka-shi, Osaka (JP)

(72) Inventor: Shuitsu Yuda, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/110,637

(22) PCT Filed: Oct. 7, 2014

(86) PCT No.: PCT/JP2014/076771
§ 371 (c)(1),
(2) Date: Jul. 8, 2016

(87) PCT Pub. No.: WO2015/107729
PCT Pub. Date: Jul. 23, 2015

(65) Prior Publication Data
US 2016/0329968 A1 Nov. 10, 2016

(30) Foreign Application Priority Data
Jan. 17, 2014 (JP) ................. 2014-007102

(51) Int. Cl.
*H04B 10/04* (2006.01)
*H04B 10/12* (2006.01)
(Continued)

(52) U.S. Cl.
CPC .......... *H04B 10/54* (2013.01); *H01S 5/0427* (2013.01); *H04Q 11/0067* (2013.01); *H01S 3/13* (2013.01); *H01S 5/042* (2013.01); *H04B 10/502* (2013.01); *H04B 10/504* (2013.01); *H04Q 2213/13292* (2013.01)

(58) Field of Classification Search
CPC .... H04B 10/54; H04B 10/502; H04B 10/504; H04B 10/077; H04B 10/06; H01S 5/0427;
(Continued)

(56) References Cited

U.S. PATENT DOCUMENTS 6,778,571 B2 * 8/2004 Vaughan ................ H01S 5/042
372/38.02
6,801,556 B2 * 10/2004 Fischer .................. H01S 5/042
372/25
(Continued)

FOREIGN PATENT DOCUMENTS

JP H09-283831 A 10/1997
JP 2007-115832 A 5/2007
(Continued)

OTHER PUBLICATIONS

IEEE Standards, "802.3ah™, IEEE Standard for Information technology—Telecommunications and information exchange between systems—Local and metropolitan area networks—Specific requirements, Part 3: Carrier Sense Multiple Access with Collision Detection (CSMA/CD) Access Method and Physical Layer Specifications, Amendment: Media Access Control Parameters, Physical Layers, and Management Parameters for Subscriber Access Networks", IEEE Std 802.3ah™—2004 (Amendment to IEEE Std 802.3™—2002 as amended by IEEE Stds 802.3ae™—2002, 802.3af™—2002, 802.3aj™—2003 and 802.3ak™—2004), IEEE Computer Society, Sep. 7, 2004, pp. 1-623.

*Primary Examiner* — Ken N Vanderpuye
*Assistant Examiner* — Abbas H Alagheband
(74) *Attorney, Agent, or Firm* — Drinker Biddle & Reath LLP

(57) ABSTRACT

A drive circuit includes a bias current supply circuit for supplying a bias current to a light-emitting element and a modulated current supply circuit for supplying a modulated
(Continued)

current to the light-emitting element, and has a first path through which the bias current flows, a second path including a path for supplying the modulated current to the light-emitting element from the modulated current supply circuit, through which a current returns to the bias current supply circuit through the modulated current supply circuit from the bias current supply circuit without going through the light-emitting element when the bias current flows, and a third path which is joined to the second path in the modulated current supply circuit and has an adjusting resistance before a junction, through which a current flows through the adjusting resistance to the bias current supply circuit when the bias current flows.

6 Claims, 17 Drawing Sheets

(51) Int. Cl.
  *H04J 14/08* (2006.01)
  *H04B 10/54* (2013.01)
  *H04Q 11/00* (2006.01)
  *H04B 10/50* (2013.01)
  *H01S 5/042* (2006.01)
  *H01S 3/13* (2006.01)

(58) Field of Classification Search
  CPC .. H01S 5/06; H01S 5/042; H01S 3/13; H04Q 11/0067; H04Q 2213/13292
  USPC .................... 398/186, 98, 30, 135
  See application file for complete search history.

(56) References Cited

U.S. PATENT DOCUMENTS

| | | | |
|---|---|---|---|
| 7,356,058 B2* | 4/2008 | Koren | H01S 5/042 372/38.01 |
| 7,483,459 B2* | 1/2009 | Uesaka | H01S 5/042 372/34 |
| 8,611,385 B2* | 12/2013 | Brenden | G11B 13/04 372/38.02 |
| 8,716,950 B2* | 5/2014 | Peting | H05B 33/0824 315/185 R |
| 8,831,059 B2* | 9/2014 | Nogami | H01S 5/0427 372/38.02 |
| 9,124,063 B2* | 9/2015 | Yuda | H01S 5/0427 |
| 9,525,480 B2* | 12/2016 | Yuda | H04B 10/502 |
| 2003/0043869 A1* | 3/2003 | Vaughan | H01S 5/042 372/38.02 |
| 2003/0218585 A1* | 11/2003 | Hoshi | H04B 10/504 345/82 |
| 2007/0098026 A1* | 5/2007 | Uesaka | H01S 5/042 372/29.01 |
| 2007/0153849 A1* | 7/2007 | Koren | H01S 5/042 372/38.02 |
| 2009/0142074 A1* | 6/2009 | Ide | H04B 10/695 398/202 |
| 2010/0135665 A1* | 6/2010 | Lee | H04B 10/29 398/99 |
| 2013/0308669 A1* | 11/2013 | Nogami | H01S 5/0427 372/38.07 |
| 2014/0023374 A1* | 1/2014 | Yuda | H01S 5/0427 398/98 |
| 2015/0188627 A1* | 7/2015 | Yuda | H04B 10/502 398/30 |

FOREIGN PATENT DOCUMENTS

| | | | | |
|---|---|---|---|---|
| JP | 2010-129570 A | 6/2010 | | |
| JP | 2010-129571 A | 6/2010 | | |
| JP | 2010129571 A | * 6/2010 | ............ | H01S 5/02 |
| JP | 2010129571 A | * 6/2010 | ............ | H01S 5/02 |
| JP | 2010-267924 A | 11/2010 | | |
| JP | 2010267924 A | * 11/2010 | ............ | H01S 5/062 |
| WO | WO-2013/031275 A1 | 3/2013 | | |

* cited by examiner

| Rct | IMPEDANCE OF A | NON-EFFECTIVE CURRENT (Vf/COMBINED RESISTANCE) | |
|---|---|---|---|
| 1000pF (OPEN IN DC MANNER) | 25Ω | 1.5/50=30[mA] | (±0%) |
| 100Ω | 20Ω | 1.5/45=33[mA] | (+10%) |
| 37.5Ω | 15Ω | 1.5/40=37.5[mA] | (+25%) |
| 16.7Ω | 10Ω | 1.5/35=42.9[mA] | (+43%) |
| 6.25Ω | 5Ω | 1.5/30=50[mA] | (+67%) |
| 0Ω (SHORT-CIRCUITED) | 0Ω | 1.5/25=60[mA] | (+100%) |

FIG.16

|  | TERMINAL C=1000pF | | TERMINAL R=0Ω | |
| --- | --- | --- | --- | --- |
|  | 10.3125Gbps | 1.25Gbps | 10.3125Gbps | 1.25Gbps |
| -5deg.C | 6.99dB | 7.68dB | 7.14dB | 8.54dB |
| 25deg.C | 6.96dB | 8.16dB | 6.75dB | 8.42dB |
| 70deg.C | 7.93dB | 9.62dB | 6.62dB | 8.50dB |
| AMOUNT OF CHANGE IN EXTINCTION RATIO | +0.94dB | +1.94dB | -0.52dB | -0.04dB |

FIG.19

|  | TERMINAL C=1000pF | | TERMINAL R=0Ω | | TERMINAL R=100Ω |
| --- | --- | --- | --- | --- | --- |
|  | 10.3125Gbps | 1.25Gbps | 10.3125Gbps | 1.25Gbps | 10.3125Gbps |
| −5deg.C | 6.59dB | 7.68dB | 7.14dB | 8.54dB | 7.00dB |
| 25deg.C | 6.96dB | 8.16dB | 6.75dB | 8.42dB | 6.95dB |
| 70deg.C | 7.53dB | 9.62dB | 6.62dB | 8.50dB | 6.81dB |
| AMOUNT OF CHANGE IN EXTINCTION RATIO | +0.94dB | +1.94dB | −0.52dB | −0.04dB | −0.19dB | ure, in the optical network unit, burst response
DRIVE CIRCUIT AND OPTICAL NETWORK UNIT

TECHNICAL FIELD

The present invention relates to a drive circuit and an optical network unit, and particularly to a drive circuit which drives a light-emitting element for transmitting an optical signal, and an optical network unit including the same.

BACKGROUND ART

The Internet has widely been used in recent years and users can access various types of information on sites operated all over the world and can obtain such information. Use of devices adapted to broadband access such as asymmetric digital subscriber line (ADSL) and fiber to the home (FTTH) has also rapidly spread accordingly.

IEEE Std 802.3ah™-2004 (NPD 1) discloses one scheme for a passive optical network (PON), which is medium-sharing-type communication in which a plurality of optical network units (ONUs) share an optical communication line and transmit data with an optical line terminal (OLT). Namely, NPD 1 defines Ethernet® PON (EPON), under which all information including user information passing through a PON and control information for administering and operating a PON is communicated in a form of an Ethernet® frame as well as an access control protocol (multi-point control protocol (MPCP)) and an operations, administration and maintenance (OAM) protocol for EPON. By exchanging MPCP frames between an optical line terminal and an optical network unit, joining, leaving, upstream multiple access control, or the like of an optical network unit is carried out. NPD 1 describes a method of registering a new optical network unit, a report showing a request for allocation of a band, and a gate indicating a transmission instruction based on an MPCP message.

In 10G-EPON standardized as IEEE802.3av™-2009 as well, that is, EPON in which a communication rate is adapted to 10 gigabits/second, which represents a next-generation technique for gigabit Ethernet® passive optical network (GE-PON) realizing a communication rate of 1 gigabit/second, an access control protocol is premised on the MPCP.

Japanese Patent Laying-Open No. 2010-267924 (PTD 1) discloses a laser drive circuit included in a transmitter in optical communication. The laser drive circuit includes a modulation circuit which supplies a modulated current to a laser diode in accordance with input burst data and a bias circuit which provides a bias current to the laser diode. The modulation circuit includes a differential drive circuit, and the differential drive circuit and the laser diode are AC coupled to each other by a capacitive element. In the differential drive circuit, a terminal resistance for impedance matching is connected between a pair of transistors and a power supply line.

CITATION LIST

Patent Document

PTD 1: Japanese Patent Laying-Open No. 2010-267924

Non Patent Document

NPD 1: IEEE Std 802.3ah™-2004

SUMMARY OF INVENTION

Technical Problem

In a PON system, time division multiple access is adopted as a communication scheme in an uplink direction from an optical network unit to an optical line terminal. In this time division multiple access, the optical network unit transmits a burst optical signal to the optical line terminal. Therefore, in the optical network unit, a current should be supplied to a light-emitting element such as a laser diode during a period in which a burst optical signal is to be transmitted, and supply of the current should be stopped during a period other than that period.

Therefore, in the optical network unit, burst response characteristics, that is, characteristics of a speed of turning on/off of a current to be supplied to the light-emitting element, are important.

In particular in 10G-EPON, as compared with GE-PON, a time period for transmission of a burst optical signal from each optical network unit is shorter owing to a higher speed of a line, and the number of optical network units which can be connected to an optical line terminal increases. Therefore, by improving burst response characteristics, an interval between burst optical signals from the optical network units should be made smaller to thereby improve throughput of the PON system.

Here, in the configuration described in PTD 1 in which a capacitive element such as a laser drive circuit is interposed in a line for a burst signal, the capacitive element is normally temperature-dependent, and the burst response characteristics have temperature dependency. This temperature dependency may lead to deterioration in characteristics in transmission of an optical signal and may adversely affect communication.

This invention was made to solve the problems described above, and an object thereof is to provide a drive circuit and an optical network unit capable of suppressing temperature dependency in a circuit transmitting an optical signal and realizing satisfactory communication.

Solution to Problem

In order to solve the problems above, a drive circuit according to one aspect of this invention includes: a bias current supply circuit for supplying a bias current to a light-emitting element for transmitting an optical signal; a modulated current supply circuit for supplying to the light-emitting element, a modulated current having magnitude in accordance with a logical value of data to be transmitted; a first path through which the bias current flows; a second path which includes a path for supplying the modulated current to the light-emitting element from the modulated current supply circuit, through which a current returns to the bias current supply circuit through the modulated current supply circuit from the bias current supply circuit without going through the light-emitting element when the bias current flows; and a third path which is joined to the second path in the modulated current supply circuit and has an adjusting resistance before a junction, through which a current flows through the adjusting resistance to the bias current supply circuit when the bias current flows.

In order to solve the problems above, an optical network unit according to one aspect of this invention is an optical network unit in a communication system in which optical signals from a plurality of optical network units to an optical line terminal are time division multiplexed, and includes a light-emitting element for transmitting the optical signal and a drive circuit for driving the light-emitting element, and the drive circuit includes a bias current supply circuit for supplying a bias current to the light-emitting element, a modulated current supply circuit for supplying to the light-emitting element, a modulated current having magnitude in accordance with a logical value of data to be transmitted, a first path through which the bias current flows, a second path which includes a path for supplying the modulated current to the light-emitting element from the modulated current supply circuit, through which a current returns to the bias current supply circuit through the modulated current supply circuit from the bias current supply circuit without going through the light-emitting element when the bias current flows, and a third path which is joined to the second path in the modulated current supply circuit and has an adjusting resistance before a junction, through which a current flows through the adjusting resistance to the bias current supply circuit when the bias current flows.

The present invention can not only realize a drive circuit including such a characteristic circuit element but also realize a semiconductor integrated circuit implementing a part or the entirety of the drive circuit.

The present invention can not only realize an optical network unit including such a characteristic circuit element but also realize a semiconductor integrated circuit implementing a part or the entirety of the optical network unit or a system including the optical network unit.

Advantageous Effects of Invention

According to the present invention, temperature dependency in a circuit transmitting an optical signal can be suppressed and satisfactory communication can be realized.

BRIEF DESCRIPTION OF DRAWINGS

FIG. 16 is a diagram showing a summary of results of measurement shown in FIGS. 12 to 15.

FIG. 19 is a diagram showing a summary of results of measurement shown in FIGS. 12 to 14 and 18.

DESCRIPTION OF EMBODIMENTS

Figure 1:
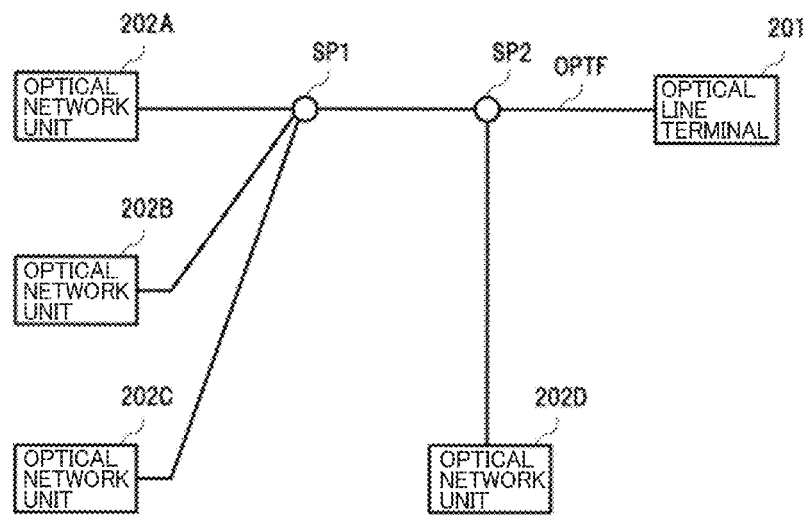
FIG. 1 is a diagram showing a configuration of a PON system according to an embodiment of the present invention.

Contents of an embodiment of the present invention will initially be listed and described.

(1) A drive circuit according to the embodiment of the present invention includes: a bias current supply circuit for supplying a bias current to a light-emitting element for transmitting an optical signal; a modulated current supply circuit for supplying to the light-emitting element, a modulated current having magnitude in accordance with a logical value of data to be transmitted; a first path through which the bias current flows; a second path which includes a path for supplying the modulated current to the light-emitting element from the modulated current supply circuit, through which a current returns to the bias current supply circuit through the modulated current supply circuit from the bias current supply circuit without going through the light-emitting element when the bias current flows; and a third path which is joined to the second path in the modulated current supply circuit and, has an adjusting resistance before a junction, through which a current flows through the adjusting resistance to the bias current supply circuit when the bias current flows.

According to such a configuration, as compared with a configuration in which only a capacitor is provided in a portion of the third path before the junction with the second path, temperature dependency of burst response characteristics can be lessened and deterioration in characteristics in transmission of an optical signal can be suppressed. Therefore, temperature dependency in a circuit transmitting an optical signal can be suppressed and satisfactory communication can be realized.

(2) Preferably, the adjusting resistance has such a resistance value that magnitude of the current which flows through the third path is not lower than 2% and not higher than 70% of magnitude of the current which flows through the second path.

According to such a configuration, even when the third path is not DC isolated from the bias current supply circuit, a non-effective current which does not contribute to drive of the light-emitting element, that is, a current which flows between the third path and the bias current supply circuit, can be lowered.

(3) Preferably, the modulated current supply circuit includes a differential drive circuit switched to allow or not to allow supply of the current to the light-emitting element in accordance with the logical value of the data and a first terminal resistance and a second terminal resistance connected in series between differential outputs of the differential drive circuit, and the third path is joined to the second path between the first terminal resistance and the second terminal resistance.

Thus, with the configuration including the first terminal resistance and the second terminal resistance which are terminal resistances, deterioration in transmission characteristics in the differential drive circuit can be suppressed in particular in transmission of a high-frequency optical signal. In addition, occurrence of ringing due to an unstable potential at a connection node between the first terminal resistance and the second terminal resistance can be suppressed.

(4) Preferably, the bias current supply circuit starts supply of the bias current when a transmission enable signal for transmitting a burst optical signal is activated.

According to such a configuration, in particular in a circuit which transmits a burst optical signal, to which supply of the bias current is started in response to activation of a transmission enable signal, a behavior of the circuit at the time of start of supply of the bias current can be stabilized.

(5) Preferably, the optical signal has a bit rate higher than 2.5 gigabits/second.

According to such a configuration, in particular in an optical communication system in which an optical signal at a high bit rate higher than 2.5 gigabits/second is transmitted, temperature dependency in a circuit transmitting an optical signal can be suppressed and satisfactory communication can be realized.

(6) An optical network unit according to the embodiment of the present invention is an optical network unit in a communication system in which optical signals from a plurality of optical network units to an optical line terminal are time division multiplexed, and includes a light-emitting element for transmitting the optical signal and a drive circuit for driving the light-emitting element, and the drive circuit includes a bias current supply circuit for supplying a bias current to the light-emitting element, a modulated current supply circuit for supplying to the light-emitting element, a modulated current having magnitude in accordance with a logical value of data to be transmitted, a first path through which the bias current flows, a second path which includes a path for supplying the modulated current to the light-emitting element from the modulated current supply circuit, through which a current returns to the bias current supply circuit through the modulated current supply circuit from the bias current supply circuit without going through the light-emitting element when the bias current flows, and a third path which is joined to the second path in the modulated current supply circuit and has an adjusting resistance before a junction, through which a current flows through the adjusting resistance to the bias current supply circuit when the bias current flows.

According to such a configuration, as compared with a configuration in which only a capacitor is provided in a portion of the third path before the junction with the second path, temperature dependency of burst response characteristics can be lessened and deterioration in characteristics in transmission of an optical signal can be suppressed. Therefore, temperature dependency in a circuit transmitting an optical signal can be suppressed and satisfactory communication can be realized.

The embodiment of the present invention will be described hereinafter with reference to the drawings. The same or corresponding elements in the drawings have the same reference characters allotted and description thereof will not be repeated. At least a part of the embodiment described below may arbitrarily be combined.

FIG. 1 is a diagram showing a configuration of a PON system according to the embodiment of the present invention.

Referring to FIG. 1, a PON system 301 includes optical network units 202A, 202B, 202C, and 202D, an optical line terminal 201, and splitters SP1 and SP2. Each of optical network units 202A, 202B, and 202C and optical line terminal 201 are connected to each other through splitters SP1 and SP2 and an optical fiber OPTF, and transmit and receive an optical signal to and from each other. Optical network unit 202D and optical line terminal 201 are connected to each other through splitter SP2 and optical fiber OPTF, and transmit and receive an optical signal to and from each other. In PON system 301, optical signals from optical network units 202A, 202B, 202C, and 202D to optical line terminal 201 are time division multiplexed. In PON system 301, for example, a bit rate of an optical signal is higher than 2.5 gigabits/second. Description below will be given, assuming that PON system 301 is adapted to 10G-EPON.

Figure 2:
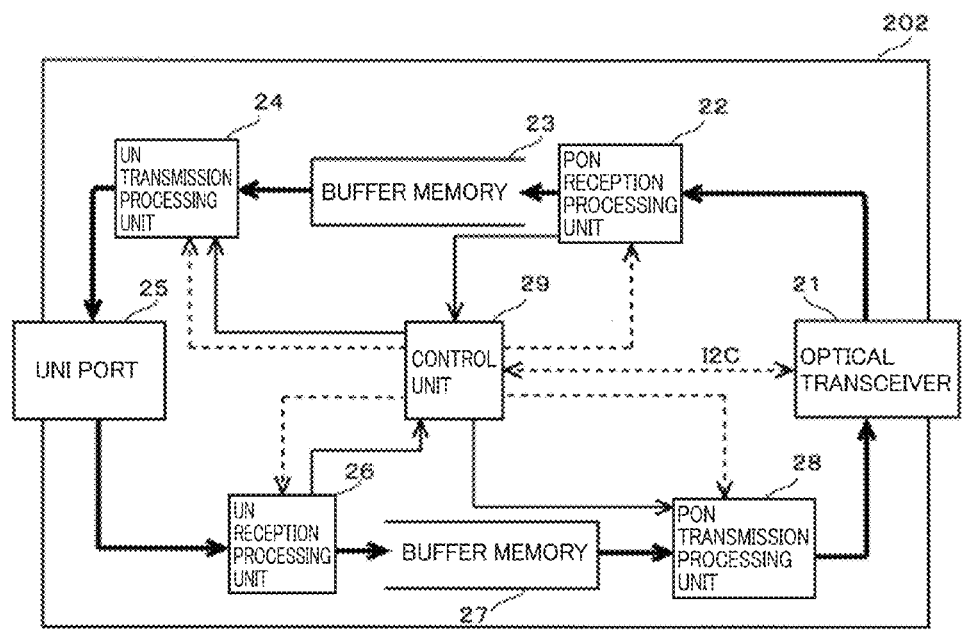
FIG. 2 is a diagram showing a configuration of an optical network unit in the PON system according to the embodiment of the present invention.

FIG. 2 is a diagram showing a configuration of the optical network unit in the PON system according to the embodiment of the present invention.

Referring to FIG. 2, an optical network unit 202 includes an optical transceiver 21, a PON reception processing unit 22, a buffer memory 23, a UN transmission processing unit 24, a user network interface (UNI) port 25, a UN reception processing unit 26, a buffer memory 27, a PON transmission processing unit 28, and a control unit 29.

Optical transceiver 21 is attachable to and removable from optical network unit 202. Optical transceiver 21 receives a downlink optical signal transmitted from optical line terminal 201, and converts the downlink optical signal to an electric signal and outputs the electric signal.

PON reception processing unit 22 reconfigures a frame from the electric signal received from optical transceiver 21 and distributes the frame to control unit 29 or UN transmission processing unit 24 in accordance with a type of the frame. Specifically, PON reception processing unit 22 outputs a data frame to UN transmission processing unit 24 through buffer memory 23 and outputs a control frame to control unit 29.

Control unit 29 generates a control frame including various types of control information and outputs the control frame to UN transmission processing unit 24.

UN transmission processing unit 24 transmits a data frame received from PON reception processing unit 22 and a control frame received from control unit 29 to a user terminal such as a not-shown personal computer through UNI port 25.

UN reception processing unit 26 outputs a data frame received from the user terminal through UNI port 25 to PON transmission processing unit 28 through buffer memory 27 and outputs a control frame received from the user terminal through UNI port 25 to control unit 29.

Control unit 29 performs optical-network-unit-side processing relating to control and administration of a PON line between optical line terminal 201 and optical network unit 202, such as MPCP and OAM. Namely, control unit 29 carries out various types of control such as access control, by exchanging an MPCP message and an OAM message with optical line terminal 201 connected to the PON line. Control unit 29 generates a control frame including various types of control information and outputs the control frame to PON transmission processing unit 28. Control unit 29 performs various types of processing for setting each unit in optical network unit 202.

PON transmission processing unit 28 outputs a data frame received from UN reception processing unit 26 and a control frame received from control unit 29 to optical transceiver 21.

Optical transceiver 21 converts the data frame and the control frame received from PON transmission processing unit 28 to an optical signal and transmits the optical signal to optical line terminal 201.

Figure 3:
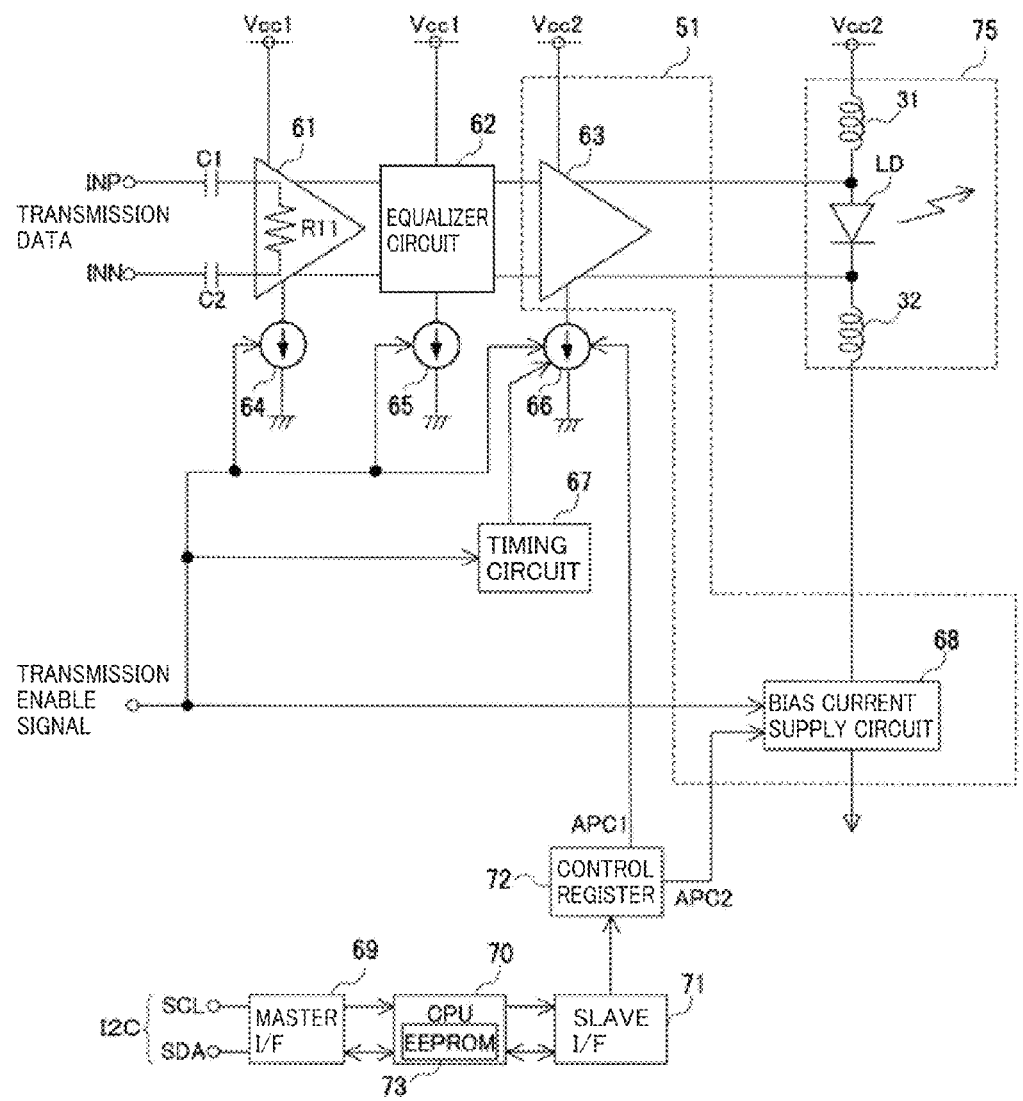
FIG. 3 is a diagram showing in detail a configuration of a transmission side of an optical transceiver in the optical network unit according to the embodiment of the present invention.

FIG. 3 is a diagram showing in detail a configuration of a transmission side of the optical transceiver in the optical network unit according to the embodiment of the present invention.

Referring to FIG. 3, optical transceiver 21 includes a pre-buffer circuit 61, an equalizer circuit 62, a drive circuit 51, power supplies 64 to 66, a timing circuit 67, a light-emitting circuit 75, a master interface (I/F) 69, a central processing unit (CPU) 70, a slave I/F 71, a control register 72, and capacitors C1 and C2. Drive circuit 51 includes an output buffer circuit (a modulated current supply circuit) 63 and a bias current supply circuit 68. Pre-buffer circuit 61 includes a terminal resistance R11. Light-emitting circuit 75 includes a light-emitting element LD and inductors 31 and 32. CPU 70 includes a storage unit 73 which is implemented, for example, by an electrically erasable programmable read only memory (EEPROM).

Pre-buffer circuit 61 receives transmission data which is a data frame from UN reception processing unit 26 and a control frame from control unit 29 at terminal resistance R11 through capacitors C1 and C2, and amplifies the transmission data and outputs the amplified transmission data. For example, pre-buffer circuit 61 receives the transmission data as a balance signal from signal lines INP and INN.

Equalizer circuit 62 subjects the transmission data received from pre-buffer circuit 61 to waveform shaping, for example, correction of phase distortion, and outputs the resultant transmission data.

Drive circuit 51 drives light-emitting element LD in light-emitting circuit 75. More specifically, output buffer circuit 63 includes a differential drive circuit having, for example, two transistors. Output buffer circuit 63 supplies a differential modulated current to light-emitting circuit 75 based on the transmission data received from equalizer circuit 62. This modulated current is a current having magnitude in accordance with a logical value of data to be transmitted to optical line terminal 201. With a configuration including the differential drive circuit, a speed of response of a modulated current to change in logical value of the transmission data can be improved.

Light-emitting circuit 75 transmits an uplink optical signal to optical line terminal 201. In light-emitting circuit 75, light-emitting element LD is connected to a power supply node supplied with a power supply voltage Vcc2 with inductor 31 being interposed and connected to bias current supply circuit 68 with inductor 32 being interposed. Light-emitting element LD emits light and changes intensity of light emission based on a bias current supplied from bias current supply circuit 68 and a modulated current supplied from output buffer circuit 63.

Power supplies 64 to 66 can supply, for example, currents as electric power to pre-buffer circuit, 61, equalizer circuit 62, and output buffer circuit 63, respectively, and can control start and stop of supply of electric power. More specifically, power supplies 64 to 66 switch whether or not to supply electric power to pre-buffer circuit 61, equalizer circuit 62, and output buffer circuit 63 based on a transmission enable signal received from control unit 29.

Specifically, power supplies 64 to 66 supply electric power to pre-buffer circuit 61, equalizer circuit 62, and output buffer circuit 63 when a transmission enable signal is activated and stop supply of electric power when the transmission enable signal is inactivated.

Timing circuit 67 carries out control for forcibly stopping supply of a modulated current from output buffer circuit 63 to light-emitting element LD.

Bias current supply circuit 68 supplies a bias current as electric power to light-emitting circuit 75. Bias current supply circuit 68 starts supply of a bias current Ibias when a transmission enable signal for transmitting a burst optical signal is activated. Namely, bias current supply circuit 68 switches whether or not to supply a bias current to light-emitting circuit 75 based on a transmission enable signal received from control unit 29. Here, in optical transceiver 21, a value for a bias current is set such that light-emitting element LD emits light when a bias current is supplied to light-emitting element LD while magnitude of a modulated current to light-emitting element LD is zero.

In light-emitting circuit 75, inductor 31 has a first end connected to the power supply node supplied with power supply voltage Vcc2 and a second end. Light-emitting element LD is implemented, for example, by a laser diode, and has an anode connected to the second end of inductor 31 and a cathode connected to a first end of inductor 32. A modulated current output from output buffer circuit 63 flows from the anode to the cathode of light-emitting element LD.

Power supply voltage Vcc2 is higher in level than a power supply voltage Vcc1. Power supply voltage Vcc1 is supplied, for example, to pre-buffer circuit 61 and equalizer circuit 62. Power supply voltage Vcc2 is supplied, for example, to output buffer circuit 63. Power supply voltage Vcc1 and power supply voltage Vcc2 are DC voltages.

CPU 70 exchanges various types of data with control unit 29, for example, through an I2C bus constituted of a signal line SCL and a signal line SDA.

Master I/F 69 provides a function as an interface between CPU 70 and the I2C bus.

Slave I/F 71 provides a function as an interface between CPU 70 and control register 72.

CPU 70 writes various types of control data into control register 72 through slave I/F 71.

Power supply 66 changes an amount of supply current to output buffer circuit 63 based on control data APC1 written in control register 72.

Bias current supply circuit 68 changes an amount of supply current to light-emitting circuit 75 based on control data APC2 written in control register 72.

Figure 4:
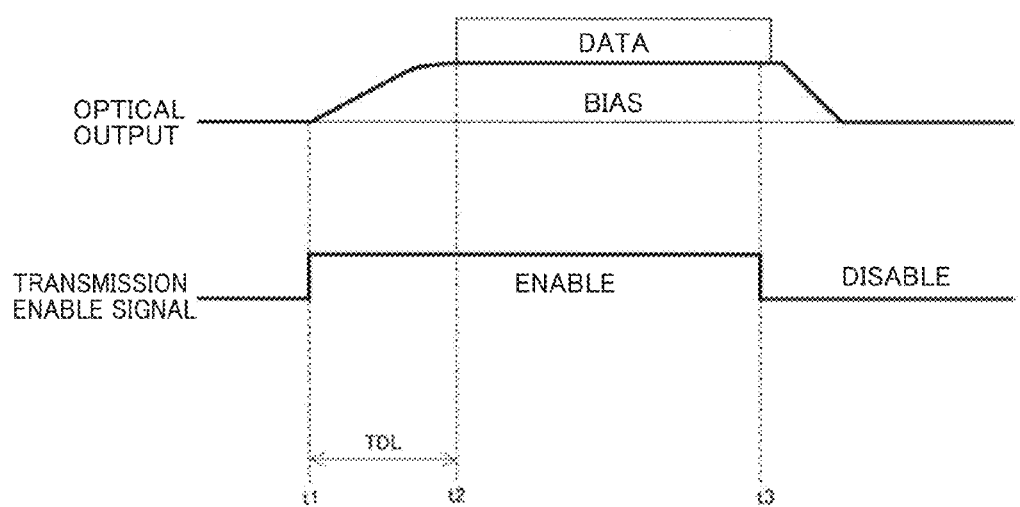
FIG. 4 is a diagram showing an optical output and a transmission enable signal in the optical transceiver of the optical network unit according to the embodiment of the present invention.

FIG. 4 is a diagram showing an optical output and a transmission enable signal in the optical transceiver of the optical network unit according to the embodiment of the present invention. A portion shown with "data" in a waveform of the optical output actually has a waveform varying between a level only having a "bias" portion and a level having a "bias" portion and a "data" portion as combined, in accordance with a logical value of transmission data.

Referring to FIG. 4, initially, during a period in which optical line terminal 201 does not permit transmission of an uplink optical signal, a transmission enable signal is inactivated. In this case, bias current supply circuit 68 does not operate and no bias current is generated.

When optical line terminal 201 permits transmission of an uplink optical signal, the transmission enable signal is activated in order to transmit an uplink optical signal from optical network unit 202. Then, bias current supply circuit 68 starts to operate, generates a bias current, and supplies the bias current to light-emitting element LD.

When the transmission enable signal is activated, power supplies 64 to 66 start to operate and supply a current to pre-buffer circuit 61, equalizer circuit 62, and output buffer circuit 63. A modulated current from output buffer circuit 63, however, is not supplied to light-emitting element LD under the control by timing circuit 67 (timing t1).

Namely, timing circuit 67 forcibly stops supply of a modulated current from output buffer circuit 63 to light-emitting element LD during a period from timing t1 until timing t2 after lapse of a time period TDL. Thus, since occurrence of overshoot resulting from a flow of a modulated current while a level of a bias current is unstable can be prevented, an operation of a circuit can be stabilized.

Then, when time period TDL elapses and supply of a modulated current to light-emitting element LD is started (timing t2), a preamble which is invalid data starts to be transmitted. Thereafter, transmission of valid data is started.

Then, when a transmission enable signal is inactivated in order to stop transmission of an uplink optical signal from optical network unit 202 (timing t3), output buffer circuit 63 and bias current supply circuit 68 stop the operation and generation of the bias current and the modulated current is stopped.

Here, when it is assumed that the laser drive circuit described in PTD 1 is employed in the optical network unit in the PON system, the differential drive circuit and the light-emitting element such as a laser diode are AC coupled to each other by the capacitive element and hence burst response characteristics deteriorate due to time constants of the terminal resistance and the capacitive element.

In order to prevent such deterioration in burst response characteristics, for example, DC coupling with the use of a resistance instead of AC coupling is possible. In such a configuration, however, a non-effective current which does not contribute to drive of the light-emitting element may flow from the differential drive circuit to the bias circuit through DC coupling.

Figure 5:
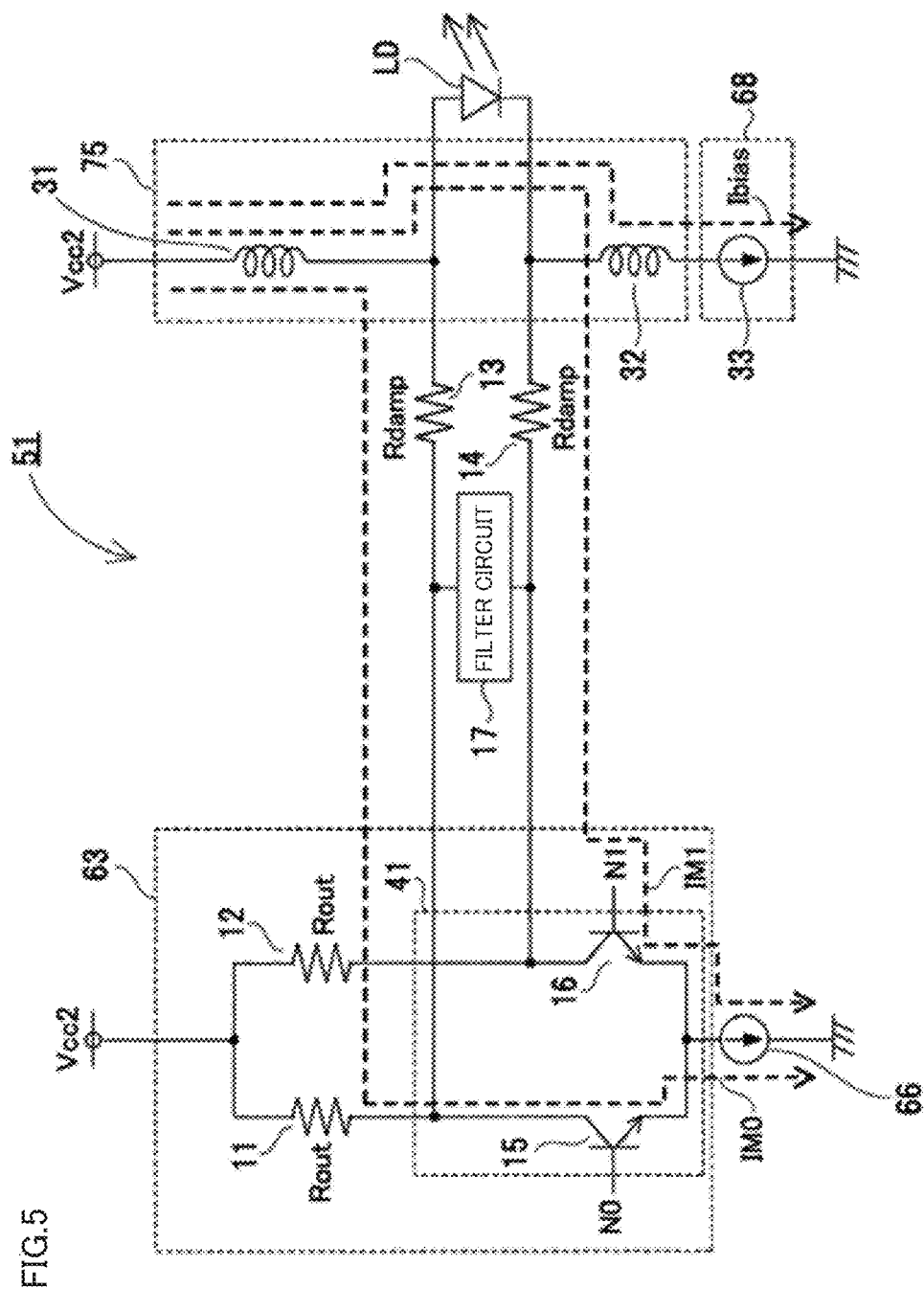
FIG. 5 is a diagram showing a configuration when it is assumed that no measures against a non-effective current are taken in a drive circuit in the optical transceiver according to the embodiment of the present invention.

FIG. 5 is a diagram showing a configuration when it is assumed that no measures against a non-effective current are taken in the drive circuit in the optical transceiver according to the embodiment of the present invention.

Referring to FIG. 5, drive circuit 51 further includes resistances 13 and 14 and a filter circuit 17. Output buffer circuit 63 includes resistances 11 and 12 and a differential drive circuit 41. Differential drive circuit 41 includes N-type transistors 15 and 16. Bias current supply circuit 68 includes a current source 33.

Differential drive circuit 41 switches whether or not to allow supply of a current to light-emitting element LD, in accordance with a logical value of transmission data.

Resistances 11 and 12 are connected between differential outputs of differential drive circuit 41. Resistance 11 and resistance 12 are connected in series between a first electrode of N-type transistor 15 and a first electrode of N-type transistor 16.

More specifically, resistance 11 has a first end connected to a power supply node supplied with power supply voltage Vcc2 and a second end. Resistance 12 has a first end connected to the power supply node supplied with power supply voltage Vcc2 and a second end. N-type transistor 15 has the first electrode connected to the second end of resistance 11, a second electrode connected to the first end of power supply 66, and a control electrode connected to a data node N0. N-type transistor 16 has the first electrode connected to the second end of resistance 12, a second electrode connected to the first end of power supply 66, and a control electrode connected to a data node N1. The second end of power supply 66 is connected to a ground node supplied with a ground voltage. Current source 33 in bias current supply circuit 68 is connected between the second end of inductor 32 and a ground node.

Data node N0 is activated when transmission data has a logical value "0" and data node N1 is activated when transmission data has a logical value "1".

Differential drive circuit 41 and light-emitting circuit 75 are DC coupled (direct-current coupled) to each other. Namely, a connection node between N-type transistor 15 and resistance 11 is DC-coupled to a connection node between the anode of light-emitting element LD and a power supply node supplied with power supply voltage Vcc2 which is a DC power supply voltage. A connection node between N-type transistor 16 and resistance 12 is DC-coupled to a connection node between the cathode of light-emitting element LD and bias current supply circuit 68.

More specifically, the connection node between the second end of resistance 11 and the first electrode of N-type transistor 15 and the connection node between the second end of inductor 31 and the anode of light-emitting element LD are connected to each other with resistance 13 being interposed. The connection node between the second end of resistance 12 and the first electrode of N-type transistor 16 and the connection node between the first end of inductor 32 and the cathode of light-emitting element LD are connected to each other with resistance 14 being interposed.

In output buffer circuit 63, resistances 11 and 12 are terminal resistances for impedance matching, which is useful for preventing ringing of a burst optical signal in particular in 10G-EPON.

For example, light-emitting element LD is contained in an assembled light-emitting module. Output buffer circuit 63, filter circuit 17, resistances 13 and 14, light-emitting circuit 75, and bias current supply circuit 68 are mounted on a print circuit board (PCB). Light-emitting circuit 75 and the light-emitting module are connected to each other with a flexible print circuit board (FPC) being interposed.

A differential output of differential drive circuit 41 in output buffer circuit 63 and light-emitting element LD are connected to each other through a transmission path. More specifically, the connection node between the first electrode of N-type transistor 15 and resistance 11 and the anode of light-emitting element LD are connected to each other through a transmission path such as a microstrip line. The connection node between the first electrode of N-type transistor 16 and resistance 12 and the cathode of light-emitting element LD are connected to each other through a transmission path such as a microstrip line. This transmission path has a length, for example, from 25 mm to 30 mm and a characteristic impedance, for example, of 25Ω.

An impedance of light-emitting circuit 75 and bias current supply circuit 68 does not particularly have to be taken into account, and preferably, light-emitting circuit 75 and bias current supply circuit 68 are low impedance in DC manner and high impedance in AC manner.

Resistances 13 and 14 are damping resistances provided in order to correct frequency characteristics of a burst optical signal and compensate for lowering in impedance due to a parasitic capacitance on the side of output buffer circuit 63. With resistances 13 and 14, deterioration in burst response characteristics can be prevented as described previously.

Filter circuit 17 is provided between resistance 13 and resistance 14 in order to remove a high-frequency component such as a modulated current which flows between differential drive circuit 41 and light-emitting circuit 75.

An operation of drive circuit 51 is as follows. Namely, when transmission data has a logical value "1", N-type transistor 15 is turned off and N-type transistor 16 is turned on. Thus, a current IM1 flows from the power supply node of light-emitting circuit 75 through light-emitting element LD and N-type transistor 16 of differential drive circuit 41 to the ground node of output buffer circuit 63. Namely, a modulated current of magnitude to some extent is supplied to light-emitting element LD.

When transmission data has a logical value "0", N-type transistor 15 is turned on and N-type transistor 16 is turned off. Thus, a current IM0 flows from the power supply node of light-emitting circuit 75 without going through light-emitting element LD but through N-type transistor 15 of differential drive circuit 41 to the ground node of output buffer circuit 63. Namely, magnitude of a modulated current to light-emitting element LD is zero.

Regardless of a logical value of transmission data, owing to current source 33, bias current Ibias flows from the power supply node of light-emitting circuit 75 through light-emitting element LD to the ground node of bias current supply circuit 68.

N-type transistors 15 and 16 can each be implemented, for example, by an NPN transistor or an N-channel MOS transistor. When each of N-type transistors 15 and 16 is implemented by an NPN transistor, the "first electrode", the "second electrode", and the "control electrode" correspond to the collector, the emitter, and the base, respectively. When each of N-type transistors 15 and 16 is implemented by an N-channel MOS transistor, the "first electrode", the "second electrode", and the "control electrode" correspond to the drain, the source, and the gate, respectively.

Figure 6:
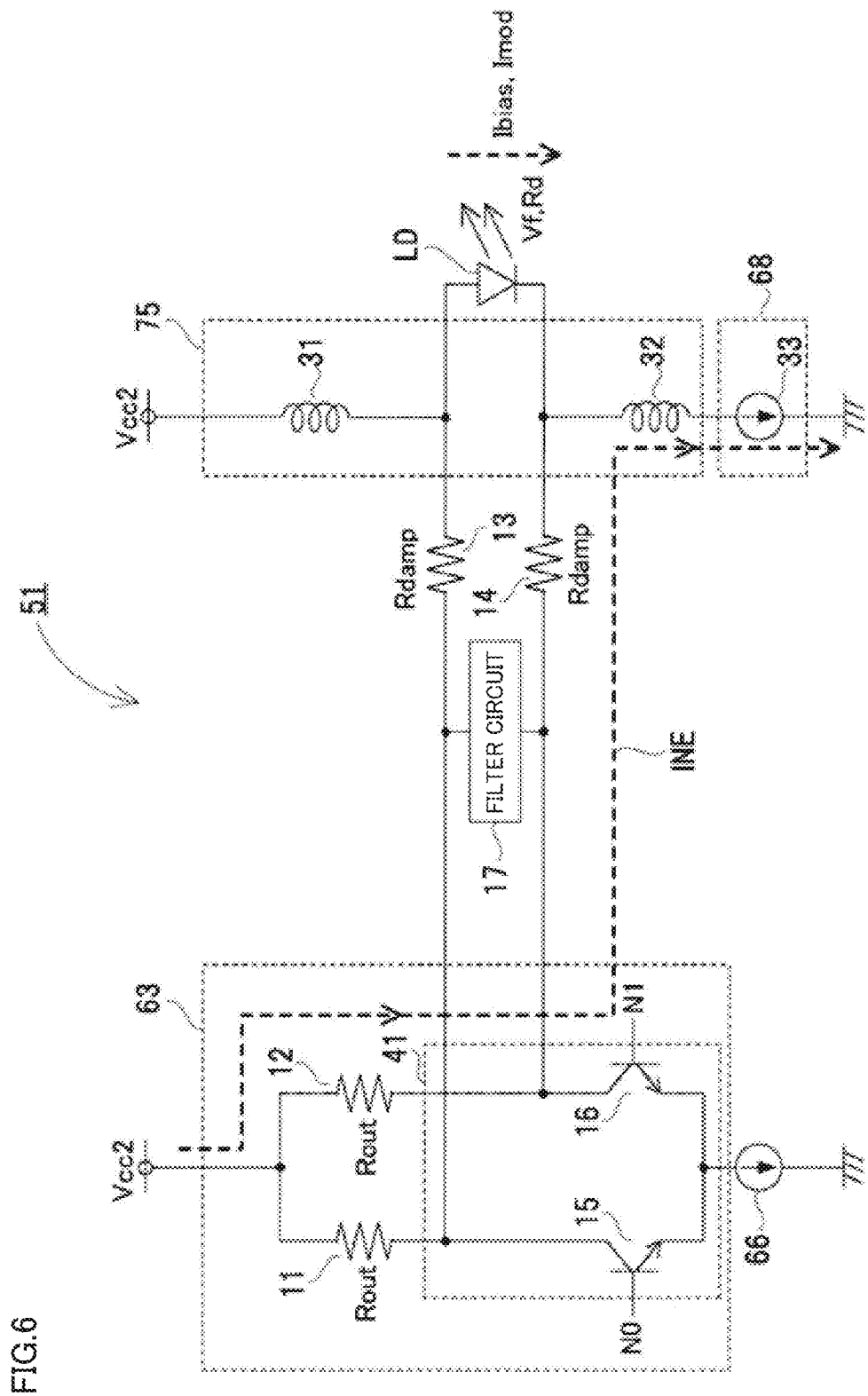
FIG. 6 is a diagram showing a non-effective current which flows in the drive circuit shown in FIG. 5.

FIG. 6 is a diagram showing a non-effective current which flows in the drive circuit shown in FIG. 5.

Referring to FIG. 6, in drive circuit 51, when transmission data has a logical value "1", a non-effective current INE flows from the power supply node of output buffer circuit 63 through resistance 12 and resistance 14 to the ground node of current source 33.

Non-effective current INE is expressed in an equation below, where Rout represents a resistance value of each of resistance 11 and resistance 12, Rdamp represents a resistance value of each of resistance 13 and resistance 14, Vf and Rd represent a forward voltage and a differential resistance of light-emitting element LD, respectively, and Ibias and Imod represent a bias current and a modulated current which flow through light-emitting element LD, respectively.

$$INE=Vf/(Rout+Rdamp)$$

An output current y from power supply 66 is expressed in an equation below.

$$y=Imod+[\{Vf+(Rd+Rdamp)\times Imod\}/Rout]$$

Here, since an input to power supply 66 is high in impedance, non-effective current INE entirely flows to current source 33. Namely, an output current x from current source 33 is expressed in an equation below.

$$x=Ibias+Vf/(Rout+Rdamp)$$

Specifically, for example, with Vf=1.4 [V], Rout=25[Ω], and Rdamp=6[Ω], output current x from current source 33 is expressed in an equation below.

$$x=Ibias+45.2$$

Then, non-effective current INE can be lowered by adopting a configuration as below in the drive circuit in optical transceiver 21.

Figure 7:
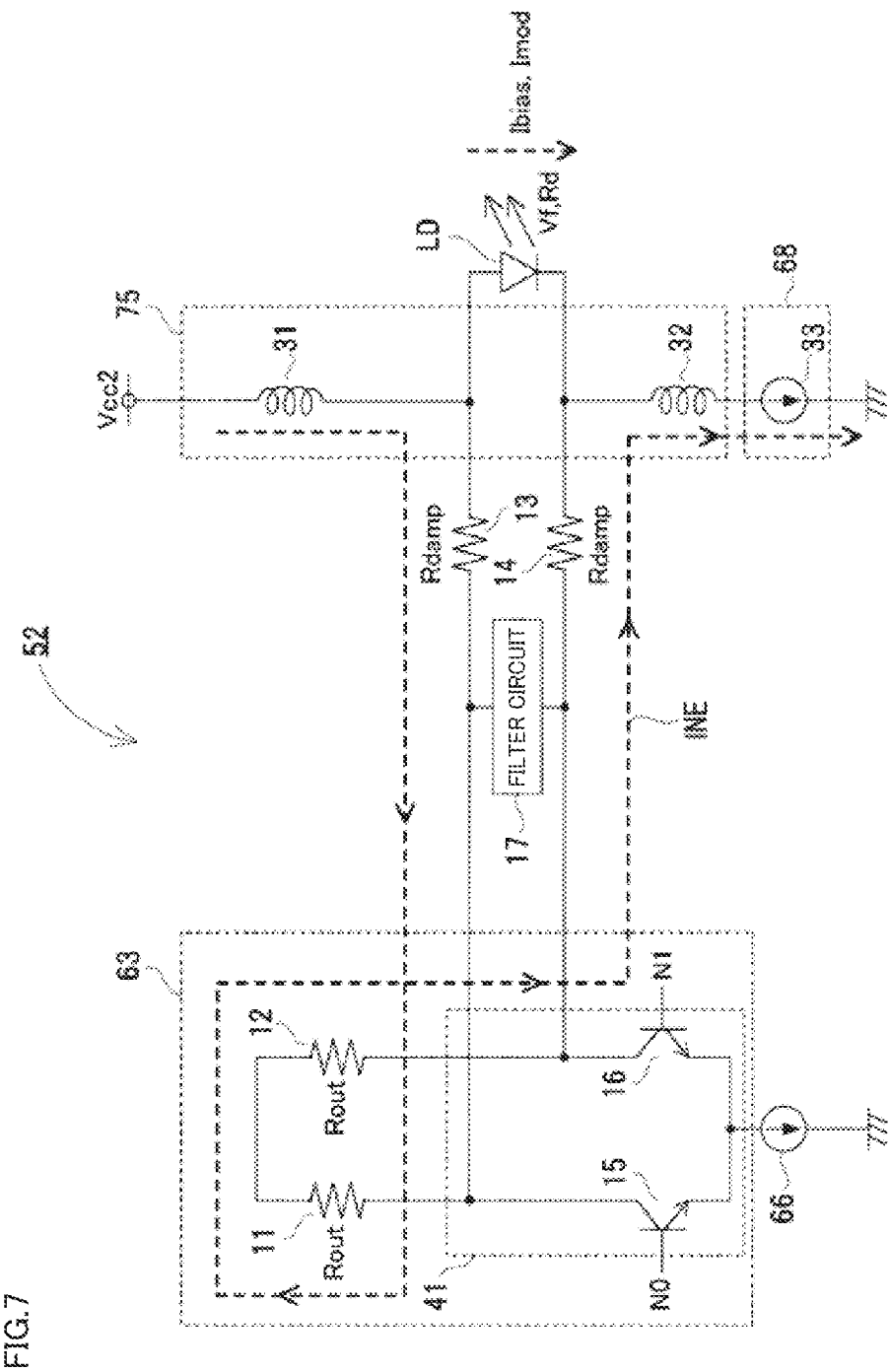
FIG. 7 is a diagram showing a configuration of a drive circuit in which one example of measures for lowering a non-effective current is adopted in the optical transceiver according to the embodiment of the present invention.

FIG. 7 is a diagram showing a configuration of a drive circuit in which one example of measures for lowering a non-effective current is adopted in the optical transceiver according to the embodiment of the present invention.

Referring to FIG. 7, a drive circuit 52 does not have the first end of resistance 11 and the first end of resistance 12 connected to the power supply node as compared with drive circuit 51 shown in FIG. 5. A power supply for a current supplied by differential drive circuit 41 to light-emitting element LD is thus provided from light-emitting circuit 75. Namely, differential drive circuit 41 supplies a current to light-emitting element ED, with electric power supplied from light-emitting circuit 75. A connection node between resistance 11 and resistance 12 is lower in potential than the power supply node of light-emitting circuit 75 by magnitude comparable to lowering in voltage at resistance 13 and resistance 11. Namely, a potential of the connection node between resistance 11 and resistance 12 is determined by power supply voltage Vcc2 supplied from the power supply node of light-emitting circuit 75.

For example, in a configuration in which output buffer circuit 63 and light-emitting circuit 75 are not DC coupled but AC coupled to each other, a path for supply of DC electric power to differential drive circuit 41 is no longer present. Therefore, the connection node between resistance 11 and resistance 12 in output buffer circuit 63 should be connected to the power supply node.

In drive circuit 52, however, output buffer circuit 63 and light-emitting circuit 75 are DC coupled to each other. Therefore, since DC electric power can be supplied from light-emitting circuit 75 through DC coupling, the connection node between resistance 11 and resistance 12 does not have to be connected to the power supply node.

Namely, with a configuration in which the connection node between resistance 11 and resistance 12 and the power supply node are not connected to each other as shown in FIG. 7, a path for non-effective current INE which flows between output buffer circuit 63 and bias current supply circuit 68 via light-emitting circuit 75 includes a path between the power supply node of light-emitting circuit 75 and output buffer circuit 63.

Specifically, non-effective current INE flows from the power supply node of light-emitting circuit 75 successively through inductor 31, resistance 13, resistance 11, resistance 12, resistance 14, inductor 32, and bias current supply circuit 68 to the ground node. Since an impedance of the path for non-effective current INE thus increases as compared with that in drive circuit 51 shown in FIG. 5, non-effective current INE can be lowered.

In drive circuit 52, non-effective current INE is expressed in an equation below.

$$INE=Vf/\{2\times(Rout+Rdamp)\}$$

Output current y from power supply 66 is expressed in an equation below.

$$y=I\text{mod}+[\{Vf+(Rd+R\text{damp})\times I\text{mod}\}/R\text{out}]$$

Here, since an input to power supply 66 is high in impedance, non-effective current INE entirely flows to current source 33. Namely, output current x from current source 33 is expressed in an equation below.

$$x=I\text{bias}+Vf/\{2\times(R\text{out}+R\text{damp})\}$$

Specifically, for example, with Vf=1.4 [V], Rout=25[Ω], and Rdamp=6[Ω], output current x from current source 33 is expressed in an equation below.

$$x=I\text{bias}+22.6$$

Namely, in drive circuit 52, as compared with drive circuit 51 shown in FIG. 5, current consumption can be reduced by 22.6 mA.

In drive circuit 52, since a potential at the connection node between resistance 11 and resistance 12 does not fluctuate so long as a duty ratio of transmission data is constant, an AC ground potential is stable at the connection node. Namely, when optical transceiver 21 transmits a continuous optical signal, stable transmission characteristics can be obtained.

When optical transceiver 21 transmits a burst optical signal, a duty ratio of transmission data during a period in which no optical signal is transmitted is zero, and the duty ratio fluctuates at the timing of start of transmission of an optical signal. Therefore, a potential at the connection node between resistance 11 and resistance 12 becomes unstable and ringing may occur in the burst optical signal.

In the embodiment of the present invention, the problem above can be solved by further adopting a configuration as below in a drive circuit in optical transceiver 21.

Figure 8:
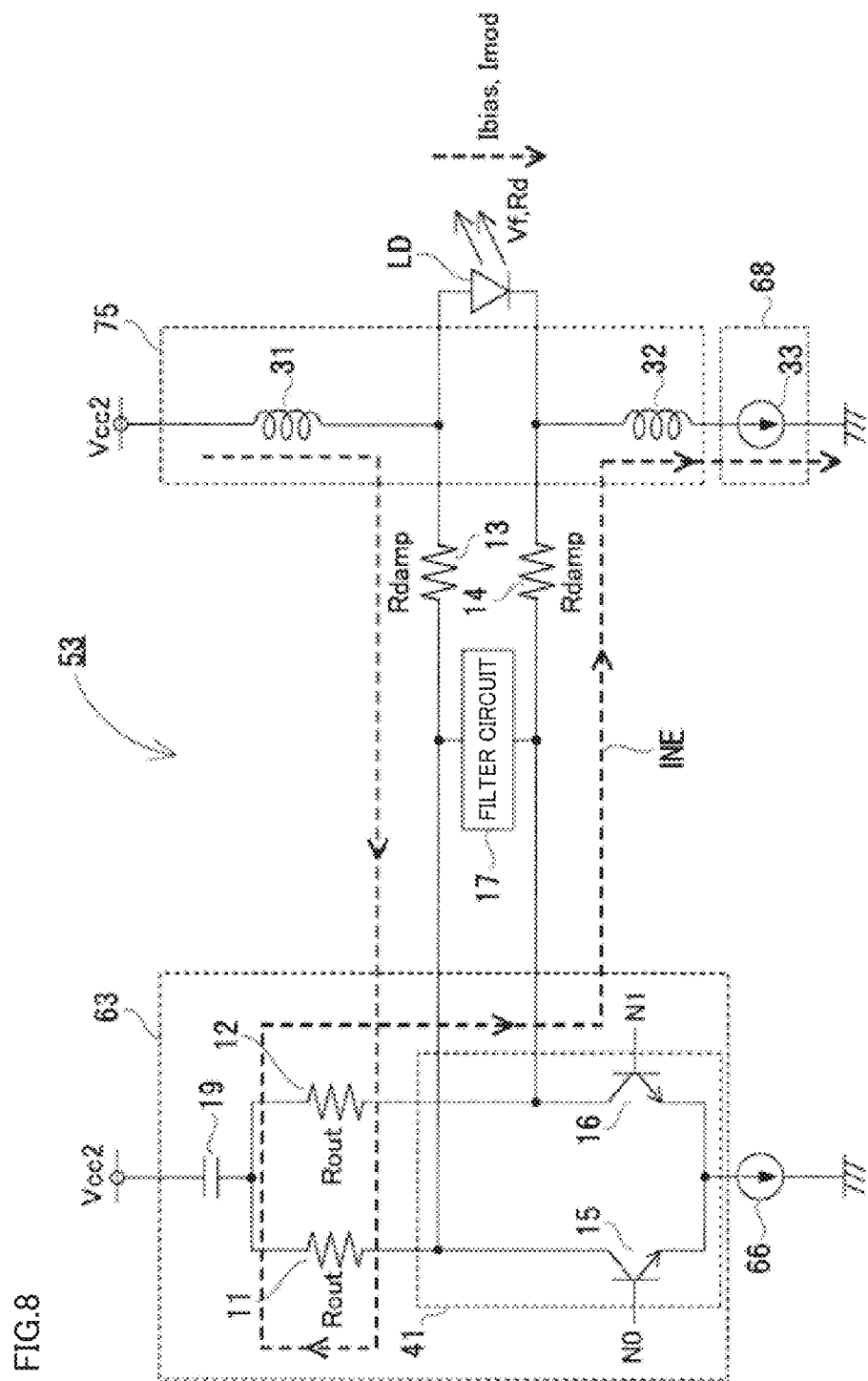
FIG. 8 is a diagram showing a configuration of a drive circuit in which one example of measures for lessening ringing is adopted in the optical transceiver according to the embodiment of the present invention.

FIG. 8 is a diagram showing a configuration of a drive circuit in which one example of measures for lessening ringing is adopted in the optical transceiver according to the embodiment of the present invention.

Referring to FIG. 8, in a drive circuit 53, output buffer circuit 63 further includes a capacitor 19 as compared with drive circuit 52 shown in FIG. 7.

Capacitor 19 is connected between the power supply node supplied with power supply voltage Vcc2 which is a fixed voltage and the connection node between resistance 11 and resistance 12. Namely, the first end of resistance 11 and the first end of resistance 12 are connected to the power supply node with capacitor 19 being interposed. Capacitor 19 has a capacitance value, for example, of 100 pF.

Resistances 11 and 12 are thus AC coupled to the node supplied with the fixed voltage, without light-emitting circuit 75 being interposed. This fixed voltage is not limited to power supply voltage Vcc2 and it may be, for example, a ground voltage.

Thus, in drive circuit 53, a capacitive element is connected between the connection node between the terminal resistances of which potential may become unstable in drive circuit 52 shown in FIG. 7 and the power supply node.

Thus, the potential at the connection node can be stabilized at power supply voltage Vcc2. Since the power supply node and each terminal resistance are AC coupled to each other, non-effective current INE from the power supply node as shown in FIG. 6 can be prevented from flowing. In drive circuit 53, non-effective current INE flows as in drive circuit 52 shown in FIG. 7.

In drive circuit 53, non-effective current INE is expressed in an equation below.

$$INE=Vf/\{2\times(R\text{out}+R\text{damp})\}$$

Output current y from power supply 66 is expressed in an equation below.

$$y=I\text{mod}+[\{Vf+(Rd+R\text{damp})\times I\text{mod}\}/R\text{out}]$$

Here, since an input to power supply 66 is high in impedance, non-effective current INE entirely flows to current source 33. Namely, output current x from current source 33 is expressed in an equation below.

$$x=I\text{bias}+Vf/\{2\times(R\text{out}+R\text{damp})\}$$

Specifically, for example, with Vf=1.4 [V], Rout=25[Ω], and Rdamp=6[Ω], output current x from current source 33 is expressed in an equation below.

$$x=I\text{bias}+22.6$$

Namely, in drive circuit 53, as in drive circuit 52 shown in FIG. 7, current consumption can be reduced by 22.6 mA as compared with drive circuit 51 shown in FIG. 5.

In drive circuit 53, time constants of capacitor 19 and resistances 11 and 12 affect burst response characteristics. When capacitor 19 has temperature dependency of ±5% within a range, for example, from −5° C. to +70° C., the time constant is varied due to this temperature dependency, and consequently burst response characteristics have temperature dependency.

Here, for an ONU adapted to 10G-EPON, for example, a direct modulation scheme in which a bias current and a modulated current supplied to a light-emitting element are directly controlled has been adopted.

In this direct modulation scheme, for a bias current, for example, such a method that a light-receiving element for monitoring receives backward light in proportion to forward light from a light-emitting element and feedback of a quantity of received light is given to a bias current supply circuit has been adopted.

Bias current Ibias can be measured by measuring an optical output P0 from light-emitting element LD at the time when transmission data has a logical value "0" in optical transceiver 21, that is, in such a state that bias current Ibias is supplied to light-emitting element LD and magnitude of modulated current Imod to light-emitting element LD is zero.

When burst response characteristics have temperature dependency as described above, however, a result of measurement of the bias current varies in accordance with a temperature, and it becomes difficult to appropriately control the bias current.

A ratio between an optical output P1 and optical output P0 from light-emitting element LD at the time when transmission data has a logical value "1", that is, in such a state that bias current Ibias and modulated current Imod having magnitude to some extent are supplied to light-emitting element LD, represents an extinction ratio. Therefore, an extinction ratio of light-emitting element LD can be adjusted by adjusting magnitude of modulated current Imod. By keeping the extinction ratio of light-emitting element LD constant by adjusting modulated current Imod, influence by fluctuation in characteristics of light-emitting element LD due to change in environmental temperature and deterioration with time can be suppressed.

When burst response characteristics have temperature dependency as described above, however, a result of measurement of a bias current varies in accordance with a temperature, and it becomes difficult to appropriately control a modulated current.

In the embodiment of the present invention, the problem above is solved by adopting a configuration as below in a drive circuit in optical transceiver 21.

Figure 9:
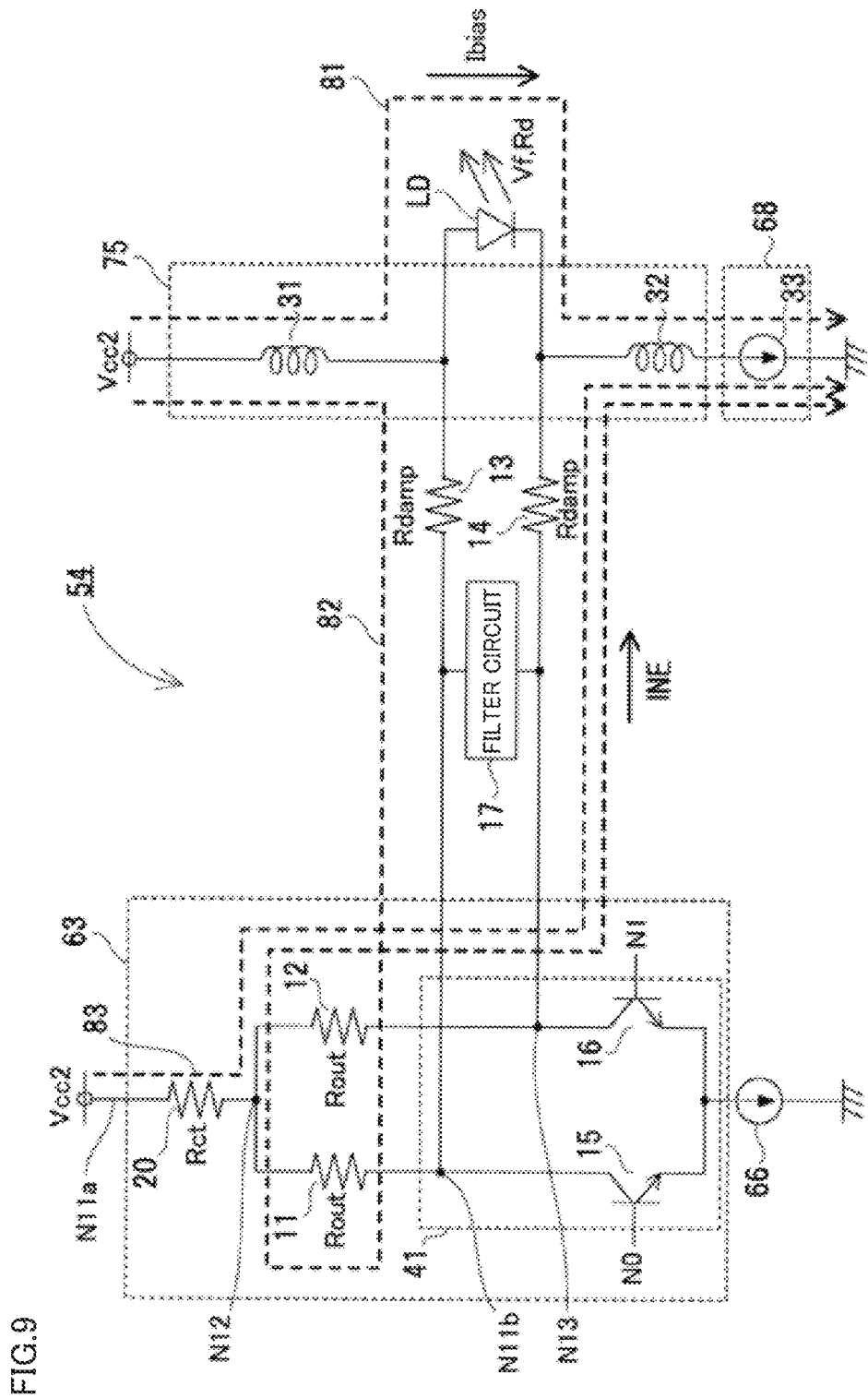
FIG. 9 is a diagram showing a configuration of a drive circuit in the optical transceiver according to the embodiment of the present invention.

FIG. 9 is a diagram showing a configuration of a drive circuit in the optical transceiver according to the embodiment of the present invention.

Referring to FIG. 9, a drive circuit 54 includes a resistance (adjusting resistance) 20 instead of capacitor 19 as compared with drive circuit 53 shown in FIG. 8.

Resistance 20 is connected between the power supply node supplied with power supply voltage Vcc2 which is a fixed voltage and the connection node between resistance 11 and resistance 12. Namely, the first end of resistance 11 and the first end of resistance 12 are connected to the power supply node with resistance 20 being interposed. For example, resistance 20 is higher in resistance value than resistance 11 and resistance 12.

Drive circuit 54 has a path 81 through which bias current Ibias flows. Drive circuit 54 has a path 82 including a path for supplying modulated current Imod from output buffer circuit 63 to light-emitting element LD, through which a current returns to bias current supply circuit 68 through output buffer circuit 63 from bias current supply circuit 68 without going through light-emitting element LD when bias current Ibias flows. Drive circuit 54 has a path 83 which is joined to path 82 in output buffer circuit 63 and has resistance 20 before a junction, through which a current flows through resistance 20 to bias current supply circuit 68 when the bias current flows. For example, path 83 is joined to path 82 between resistance 11 and resistance 12.

In other words, with the power supply node supplied with power supply voltage Vcc2 being defined as one end portion, path 81 and path 82 are separate from each other in a stage subsequent to inductor 31 from a state as being joined, and they run toward light-emitting element LD and output buffer circuit 63, respectively. Then, path 83 is joined to path 82 in output buffer circuit 63, the joined paths are joined to path 81 in a stage subsequent to resistance 14 and light-emitting element LD, and paths 81 to 83 as being joined reach the ground node which is the other end portion, through inductor 32 and current source 33.

More specifically, path 81 extends from the power supply node supplied with power supply voltage Vcc2 successively through inductor 31, light-emitting element LD, inductor 32, and current source 33 to the ground node. Path 82 extends from the power supply node supplied with power supply voltage Vcc2 successively through inductor 31, resistance 13, resistance 11, resistance 12, resistance 14, inductor 32, and current source 33 to the ground node. Path 83 extends from the power supply node supplied with power supply voltage Vcc2 successively through resistance 20, resistance 12, resistance 14, inductor 32, and current source 33 to the ground node.

Thus, resistances 11 and 12 are DC coupled to the node supplied with the fixed voltage without light-emitting circuit 75 being interposed. This fixed voltage is not limited to power supply voltage Vcc2 and it may be, for example, a ground voltage. Namely, a direction of flow of each current is not limited to the above in optical transceiver 21, positional relation between the power supply node and the ground node can also be reversed such that a direction of flow of each current is reverse to the above, and a component such as a transistor can also be changed.

Thus, in drive circuit 54, a resistance is connected between the connection node between the terminal resistance, of which potential may become unstable in drive circuit 52 shown in FIG. 7, and the power supply node.

Thus, the potential at the connection node can be stabilized at a voltage not higher than power supply voltage Vcc2.

Specifically, a DC impedance Z of a circuit configured with resistance 14, resistance 12, and resistance 20 is expressed in an equation below, where Rct represents a resistance value of resistance 20.

$$Z = (Rdamp + Rout) \times Rct / (Rdamp + Rout + Rct)$$

When Rct is sufficiently greater than (Rdamp+Rout), impedance Z is expressed in an equation below.

$$Z = (Rdamp + Rout)$$

Namely, when resistance 20 is employed instead of capacitor 19 as well, as in drive circuit 53 shown in FIG. 8, non-effective current INE can be lowered while occurrence of ringing due to an unstable potential at the connection node between resistance 11 and resistance 12 is suppressed.

Then, temperature dependency of burst response characteristics can be lessened by not including capacitor 19. Burst response can be faster by not including capacitor 19.

Drive circuit 54 is not limited to the configuration including only resistance 20 instead of capacitor 19, as compared with drive circuit 53 shown in FIG. 8. The configuration should only be such that a resistance is included in a portion of path 83 before junction with path 82. For example, a series circuit of a resistance and a capacitor or a parallel circuit of a resistance and a capacitor may be provided in that portion.

Figures 10, 11:
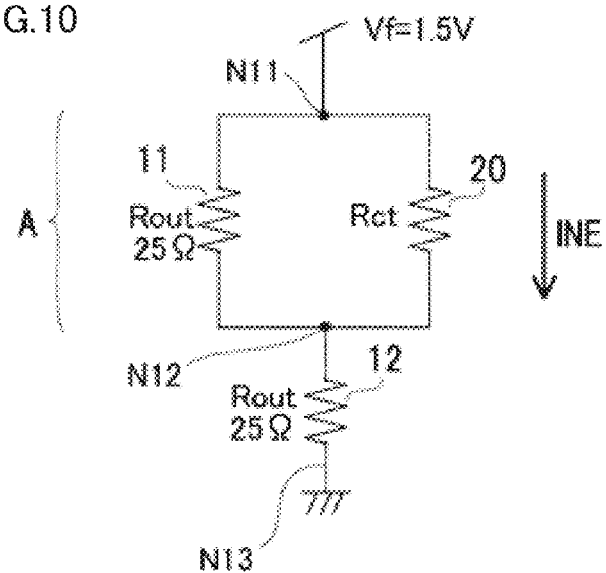
FIG. 10 is a diagram showing an equivalent circuit in a path 82 and a path 83 of the drive circuit according to the embodiment of the present invention.
FIG. 11 is a diagram showing relation among a resistance value Rct, an impedance of a parallel circuit A, and a non-effective current in the equivalent circuit shown in FIG. 10.

FIG. 10 is a diagram showing an equivalent circuit in path 82 and path 83 of the drive circuit according to the embodiment of the present invention.

Assuming Rdamp=0[Ω], Rout=25[Ω], forward voltage Vf of light-emitting element LD=1.5 [V], and inductor 31 having no resistance component, a circuit configured with resistances 11 to 14 and 20 is represented as a parallel circuit A as shown in FIG. 10.

Namely, resistance 11 having resistance value Rout and resistance 20 having resistance value Rct are connected in parallel, and this parallel circuit A has one end connected to a node supplied with voltage Vf and the other end connected to the first end of resistance 12 having resistance value Rout. The second end of resistance 12 is connected to the ground node.

A connection node N11a between the power supply node supplied with power supply voltage Vcc2 and resistance 20 and a connection node N11b between resistance 11 and resistance 13 in FIG. 9 correspond to a connection node N11 between the node supplied with voltage Vf and resistances 11 and 20 in FIG. 10. A connection node N12 among resistance 20, resistance 11, and resistance 12 in FIG. 9 corresponds to a connection node N12 among resistance 20, resistance 11, and resistance 12 in FIG. 10. A connection node N13 between resistance 12 and resistance 14 in FIG. 9 corresponds to a connection node N13 between the ground node and resistance 12 in FIG. 10.

FIG. 11 is a diagram showing relation among resistance value Rct, an impedance of parallel circuit A, and a non-effective current in the equivalent circuit shown in FIG. 10.

Referring to FIG. 11, when resistance value Rct is 1000 [pF], that is, a connection node between the terminal resistances is open in DC manner by including capacitor 19 as in the configuration shown in FIG. 8, parallel circuit A has an impedance of 25[Ω] and non-effective current INE has magnitude of Vf/combined resistance of equivalent circuit=1.5/50=30 [mA]. When resistance value Rct is 100 [Ω], parallel circuit A has an impedance of 20[Ω] and non-effective current INE has magnitude of Vf/combined resistance of equivalent circuit=1.5/45=33 [mA]. When resistance value Rct is 37.5[Ω], parallel circuit A has an impedance of 15[Ω] and non-effective current INE has magnitude of Vf/combined resistance of equivalent circuit=1.5/40=37.5 [mA]. When resistance value Rct is 16.7 [Ω], parallel circuit A has an impedance of 10[Ω] and non-effective current INE has magnitude of Vf/combined resistance of equivalent circuit=1.5/35=42.9 [mA]. When resistance value Rct is 6.25[Ω], parallel circuit A has an impedance of 5[Ω] and non-effective current INE has magnitude of Vf/combined resistance of equivalent circuit=1.5/30=50 [mA]. When resistance value Rct is 0[Ω], that is, when resistances 11 and 12 and the power supply node supplied with power supply voltage Vcc2 are short-circuited as in the configuration shown in FIG. 6, parallel circuit A has an impedance of 0[Ω] and non-effective current INE has magnitude of Vf/combined resistance of equivalent circuit=1.5/25=60 [mA].

With resistance value Rct of 1000 [pF] being defined as the reference, that is, ±0%, a rate of change in non-effective current INE is +10% when resistance value Rct is 100[Ω], it is +25% when resistance value Rct is 37.5[Ω], it is +43% when resistance value Rct is 16.7[Ω], it is +67% when resistance value Rct is 6.25[Ω], and it is +100% when resistance value Rct is 0[Ω].

With attention being paid to a rate of change in non-effective current, the drive circuit according to the embodiment of the present invention can be implemented so long as the rate of change is higher than 0% and lower than 100%, with a rate of change not lower than 2% and not higher than 70% being preferred, and a rate of change not lower than 7% and not higher than 30% being further preferred.

Namely, resistance value Rct of resistance 20 is such a value that a current which flows through path 83 has magnitude not lower than 2% and not higher than 70% of magnitude of a current which flows through path 82, that is, a non-effective current which flows at the time when no resistance 20 is provided and the connection node between resistance 11 and resistance 12 is open in DC manner.

More preferably, resistance value Rct of resistance 20 is such a value that magnitude of a current which flows through path 83 is not lower than 7% and not higher than 30% of magnitude of a current which flows through path 82.

Figure 12:
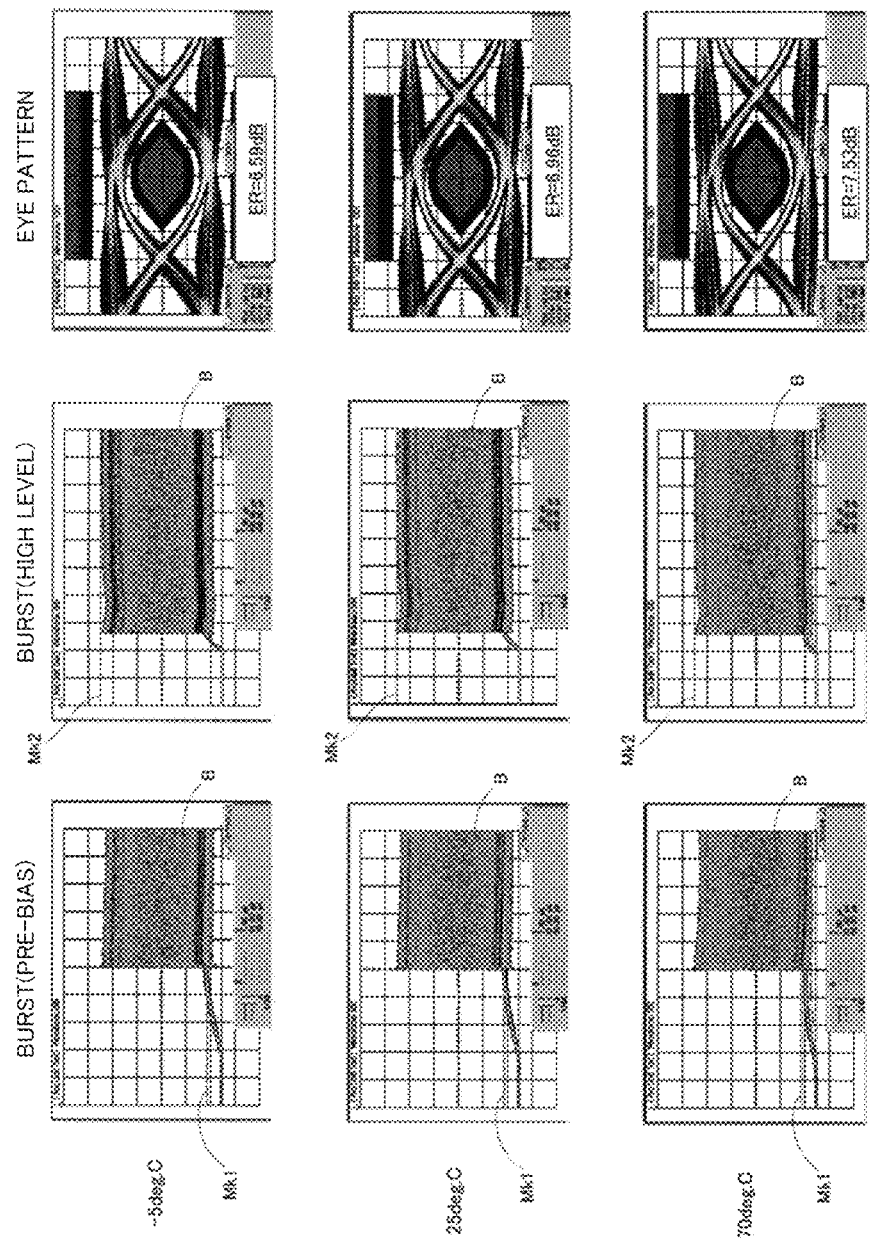
FIG. 12 is a diagram showing a result of measurement of temperature characteristics of an optical signal output from a drive circuit 53.

FIG. 12 is a diagram showing a result of measurement of temperature characteristics of an optical signal output from drive circuit 53.

In FIG. 12, the abscissa represents time and the ordinate represents power. A column of "burst (pre-bias)" shows an enlarged waveform in a pre-bias section of a burst optical signal, that is, after the timing of start of supply of bias current Ibias and within a prescribed period of time before the timing of start of supply of modulated current Imod. A column of "burst (high level)" shows a waveform with attention being paid to timing after the timing of start of supply of modulated current Imod, with the abscissa being shown as being narrowed as compared with "burst (pre-bias)". In "burst (pre-bias)" and "burst (high level)," B represents a portion where an optical signal repeats a logic high level and a logic low level. A column of "eye pattern" represents an eye pattern of an optical signal.

Scales on the abscissa and the ordinate are the same at each of −5° C., 25° C., and 70° C., and magnitude indicated by each of markers MK1 and MK2 on the ordinate is the same.

FIG. 12 shows that a terminal C, that is, capacitor 19, has a capacitance value of 1000 pF and a bit rate of an optical signal is set to 10.3125 Gbps (gigabits/second).

Referring to FIG. 12, based on the waveform of "burst (pre-bias)" at each temperature, a level of a burst optical signal in the pre-bias section lowers with increase in temperature. Based on the waveform in "eye pattern" at each temperature, an extinction ratio at −5° C. is 6.59 dB, an extinction ratio at 25° C. is 6.96 dB, and an extinction ratio at 70° C. is 7.53 dB. Namely, it can be seen that burst response characteristics have temperature dependency.

Figure 13:
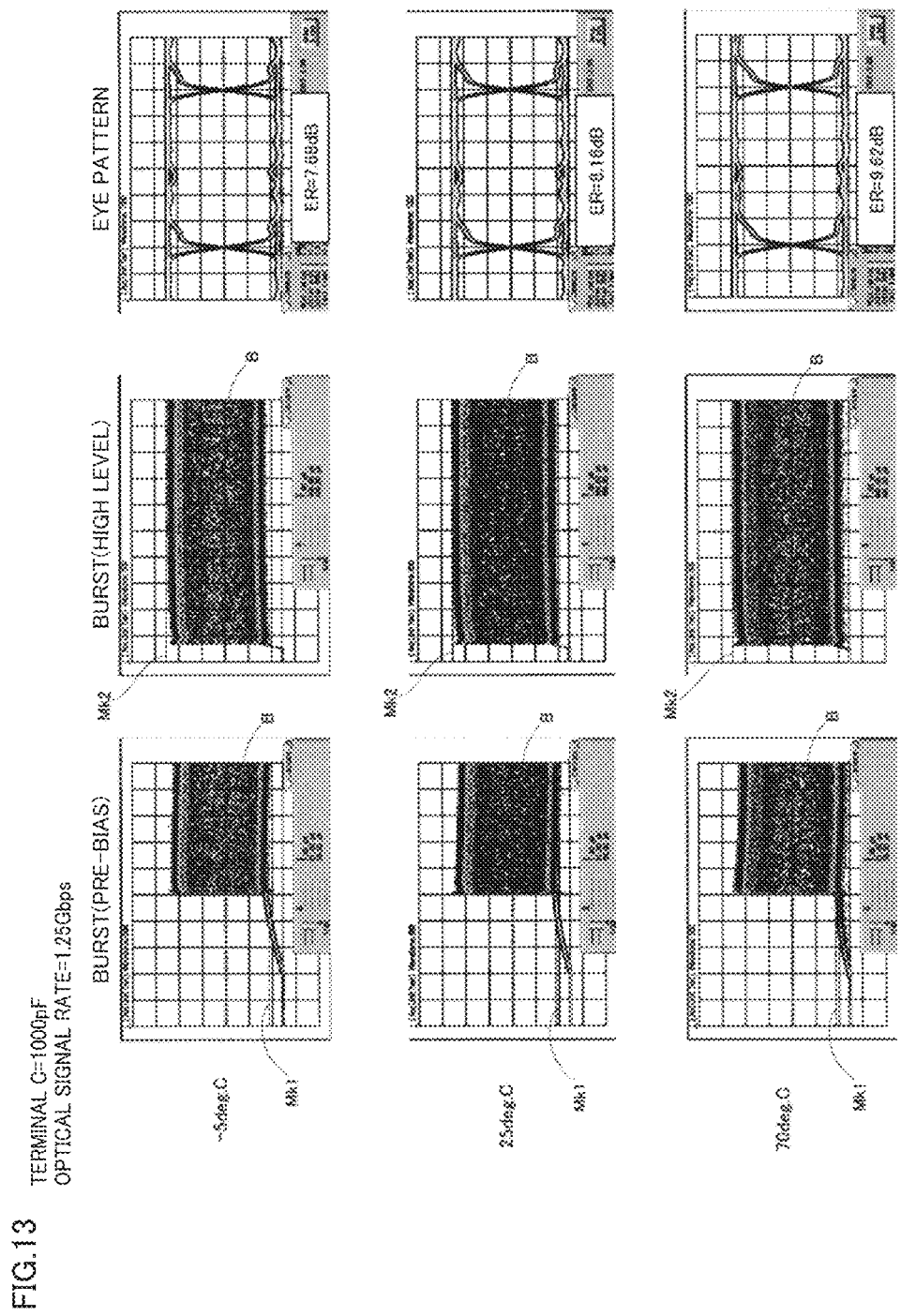
FIG. 13 is a diagram showing a result of measurement of temperature characteristics of an optical signal output from drive circuit 53.

FIG. 13 is a diagram showing a result of measurement of temperature characteristics of an optical signal output from drive circuit 53. The figure is interpreted similarly to FIG. 12.

FIG. 13 shows that terminal C, that is, capacitor 19, has a capacitance value of 1000 pF and a bit rate of an optical signal is set to 1.25 Gbps (gigabits/second).

Referring to FIG. 13, based on the waveform of "burst (pre-bias)" at each temperature, a level of a burst optical signal in the pre-bias section lowers with increase in temperature. Based on the waveform in "eye pattern" at each temperature, an extinction ratio at −5° C. is 7.68 dB, an extinction ratio at 25° C. is 8.16 dB, and an extinction ratio at 70° C. is 9.62 dB. Namely, it can be seen that burst response characteristics have temperature dependency.

Temperature dependency of the extinction ratio shown in FIG. 13 is higher than temperature dependency of the extinction ratio shown in FIG. 12. This may be because frequency characteristics of light-emitting element LD appear in a direction cancelling temperature dependency of the extinction ratio when the bit rate of the optical signal is as high as 10.3125 Gbps. Namely, variation in extinction ratio from −5° C. to 70° C. is expected to actually be less than approximately 2 dB.

Figure 14:
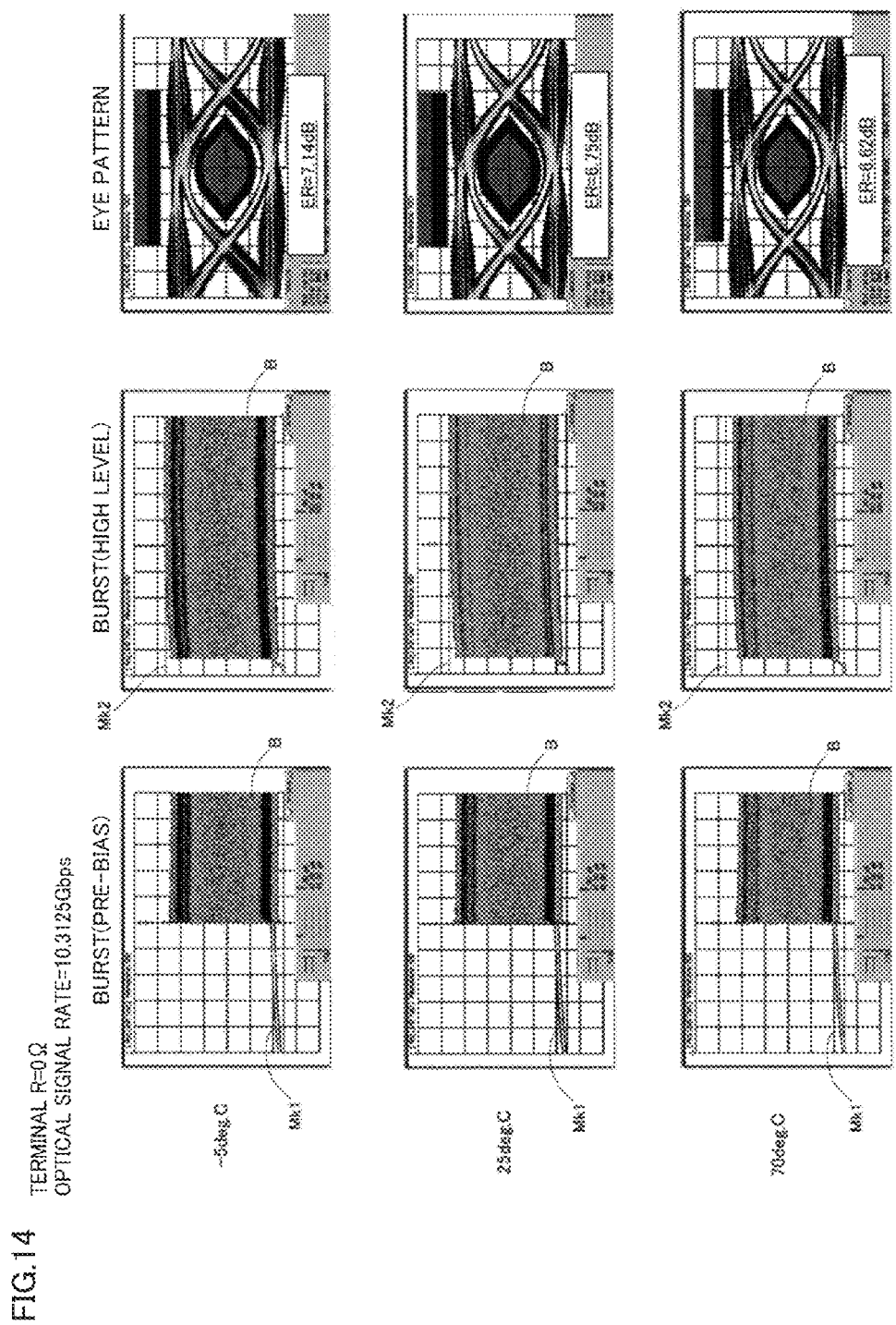
FIG. 14 is a diagram showing a result of measurement of temperature characteristics of an optical signal output from a drive circuit 51.

FIG. 14 is a diagram showing a result of measurement of temperature characteristics of an optical signal output from drive circuit 51. The figure is interpreted similarly to FIG. 12.

FIG. 14 shows that a terminal R has 0Ω, that is, resistances 11 and 12 and the power supply node supplied with power supply voltage Vcc2 are short-circuited and a bit rate of an optical signal is set to 10.3125 Gbps.

Referring to FIG. 14, based on the waveform of "burst (pre-bias)" at each temperature, a level of a burst optical signal in the pre-bias section is substantially constant regardless of the temperature. Based on the waveform in "eye pattern" at each temperature, an extinction ratio at −5° C. is 7.14 dB, an extinction ratio at 25° C. is 6.75 dB, and an extinction ratio at 70° C. is 6.62 dB. Namely, it can be seen that temperature dependency of burst response characteristics is less than in the case of burst response characteristics shown in FIG. 12.

In FIG. 14, the extinction ratio is lower with increase in temperature. This may be because of influence by frequency characteristics of light-emitting element LD as described previously.

Figure 15:
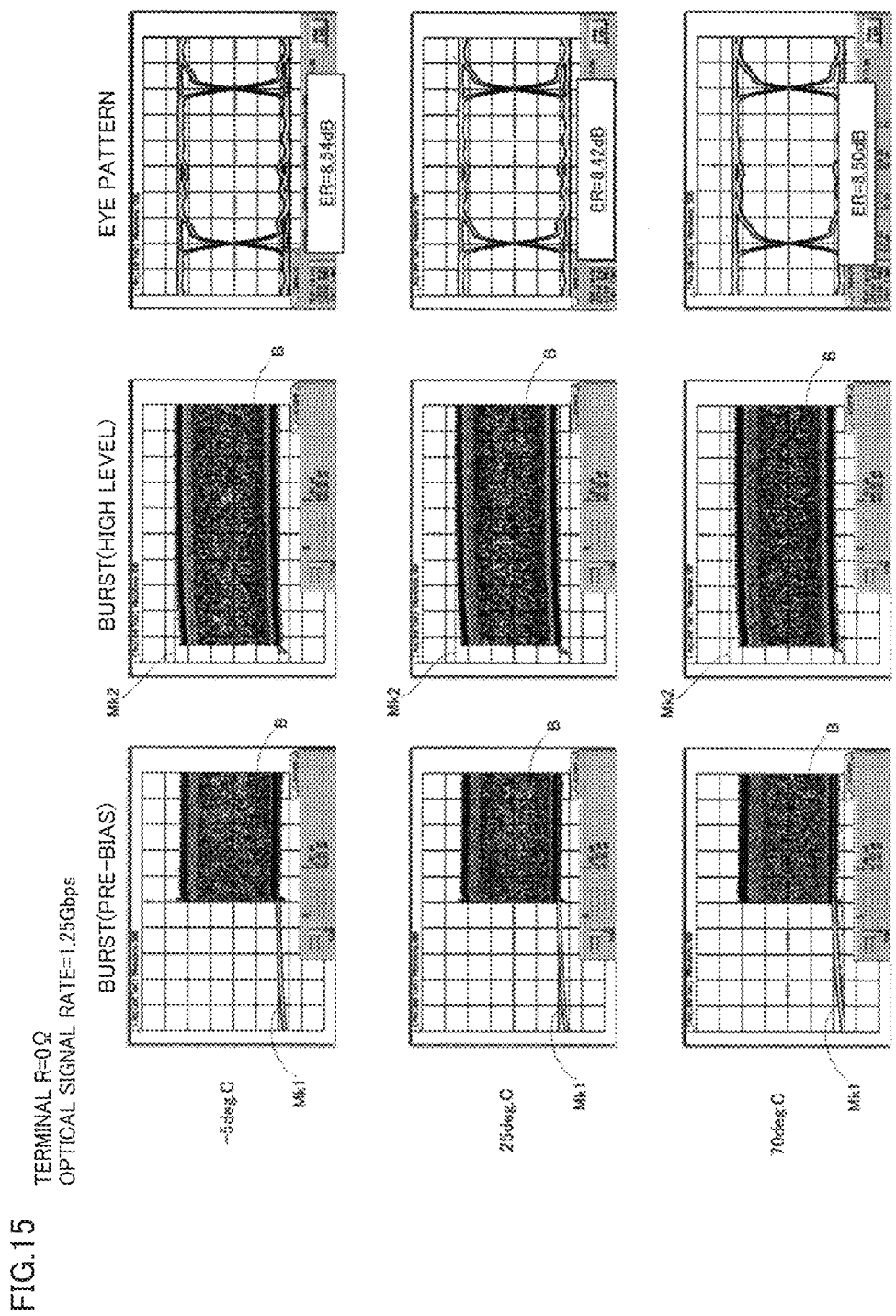
FIG. 15 is a diagram showing a result of measurement of temperature characteristics of an optical signal output from drive circuit 51.

FIG. 15 is a diagram showing a result of measurement of temperature characteristics of an optical signal output from drive circuit 51. The figure is interpreted similarly to FIG. 12.

FIG. 15 shows that terminal R has 0Ω, that is, resistances 11 and 12 and the power supply node supplied with power supply voltage Vcc2 are short-circuited and a bit rate of an optical signal is set to 1.25 Gbps.

Referring to FIG. 15, based on the waveform of "burst (pre-bias)" at each temperature, a level of a burst optical signal in the pre-bias section is substantially constant regardless of the temperature. Based on the waveform in "eye pattern" at each temperature, an extinction ratio at −5° C. is 8.54 dB, an extinction ratio at 25° C. is 8.42 dB, and an extinction ratio at 70° C. is 8.50 dB. Namely, it can be seen that the extinction ratio is substantially constant regardless of the temperature.

It can thus be demonstrated that the extinction ratio is affected by the frequency characteristics of light-emitting element LD in the case shown in FIGS. 12 and 14 where a bit rate of an optical signal is set to 10.3125 Gbps.

In the configuration shown in FIGS. 14 and 15, that is, in drive circuit 51, disadvantageously, non-effective current INE is high and power consumption is high as described previously.

FIG. 16 is a diagram showing a summary of results of measurement shown in FIGS. 12 to 15.

Referring to FIG. 16, when terminal C has 1000 pF and a bit rate of an optical signal is set to 10.3125 Gbps, variation in extinction ratio from −5° C. to 70° C. is +0.94 dB. When terminal C has 1000 pF and a bit rate of an optical signal is set to 1.25 Gbps, variation in extinction ratio from −5° C. to 70° C. is +1.94 dB. When terminal R has 0Ω and a bit rate of an optical signal is set to 10.3125 Gbps, variation in extinction ratio from −5° C. to 70° C. is −0.52 dB. When terminal R has 0Ω and a bit rate of an optical signal is set to 1.25 Gbps, variation in extinction ratio from −5° C. to 70° C. is −0.04 dB.

In the configuration having terminal R=0Ω, with a bit rate of an optical signal=1.25 Gbps, the extinction ratio does not have temperature dependency, whereas with a bit rate of an optical signal=10.3125 Gbps, the extinction ratio tends to be lower at a high temperature.

This may be because a time period for rising and falling of an optical signal is short at a high temperature.

In the configuration having terminal C=1000 pF, in any case of bit rates of an optical signal=10.3125 Gbps and 1.25 Gbps, the extinction ratio tends to increase at a high temperature and such a tendency is noticeable in particular when the bit rate is set to 1.25 Gbps.

With the configuration having terminal R=0Ω, a level of an optical signal in the pre-bias section is substantially constant at each temperature, and the tendency of increase in extinction ratio at a high temperature is not observed. Therefore, temperature dependency of the extinction ratio in the configuration having terminal C=1000 pF may be because of temperature characteristics of a time constant owing to terminal C=1000 pF.

Figure 17:
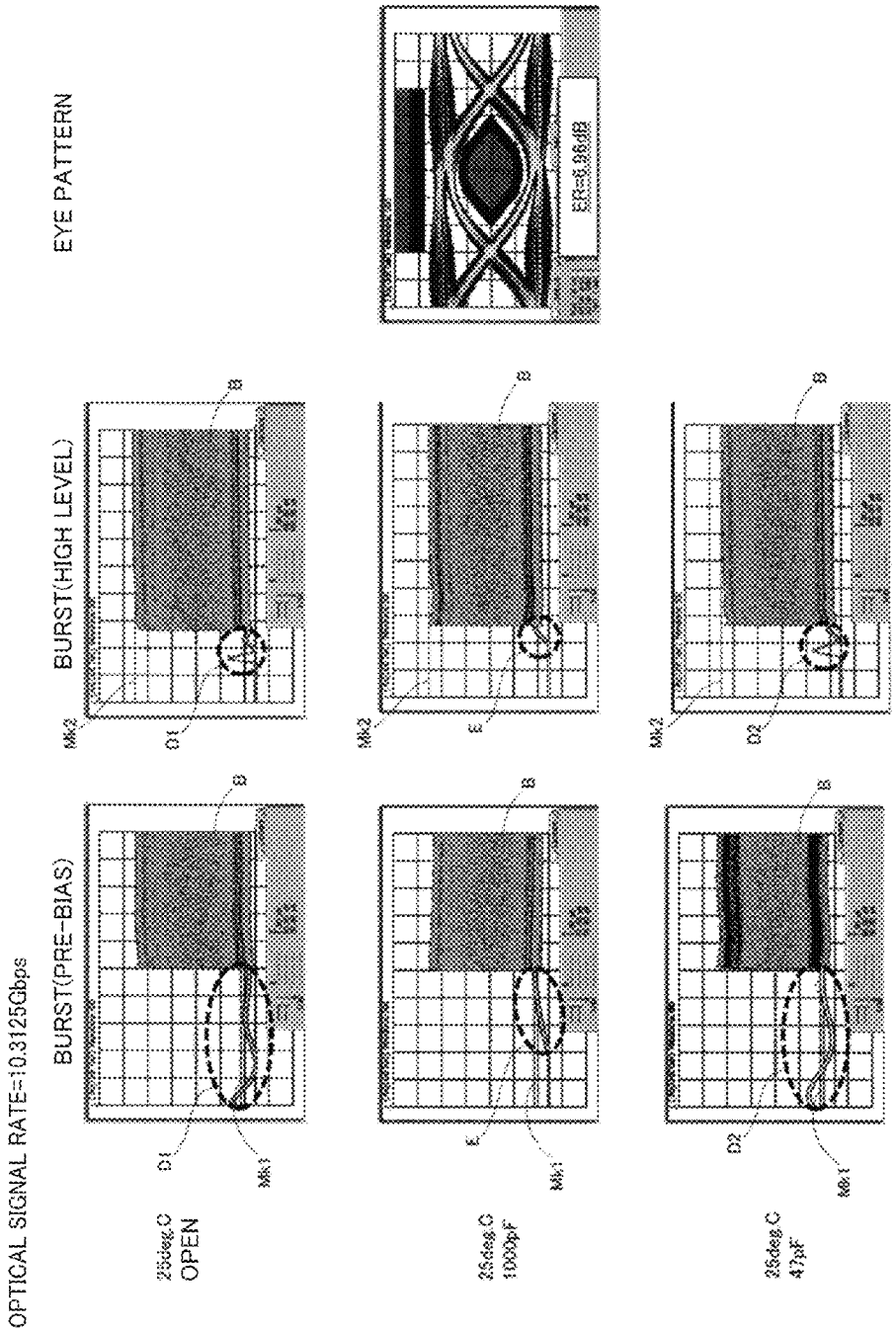
FIG. 17 is a diagram showing a result of measurement of waveforms of an optical signal when a capacitance value of a capacitor 19 is varied in drive circuit 53.

FIG. 17 is a diagram showing a result of measurement of waveforms of an optical signal when a capacitance value of capacitor 19 is varied in drive circuit 53. The figure is interpreted similarly to FIG. 12. FIG. 17 shows a result of measurement at 25° C.

Referring to FIG. 17, in drive circuit 53 including capacitor 19 having a capacitance value of 1000 pF, no ringing occurs in a rising portion E of a burst optical signal.

In contrast, in a configuration of drive circuit 53 from which capacitor 19 has been removed, that is, in drive circuit 52 shown in FIG. 7, ringing is great in a rising portion D1 of a burst optical signal. In a configuration of drive circuit 53 in which capacitor 19 has a lower capacitance value of 47 pF, similarly, ringing is great in a rising portion D2 of a burst optical signal.

Thus, it can be seen that simple removal of capacitor 19 to thereby open the connection node between the terminal resistances or lowering in capacitance value of capacitor 19 is inappropriate, because ringing becomes greater, although burst response is faster.

Figure 18:
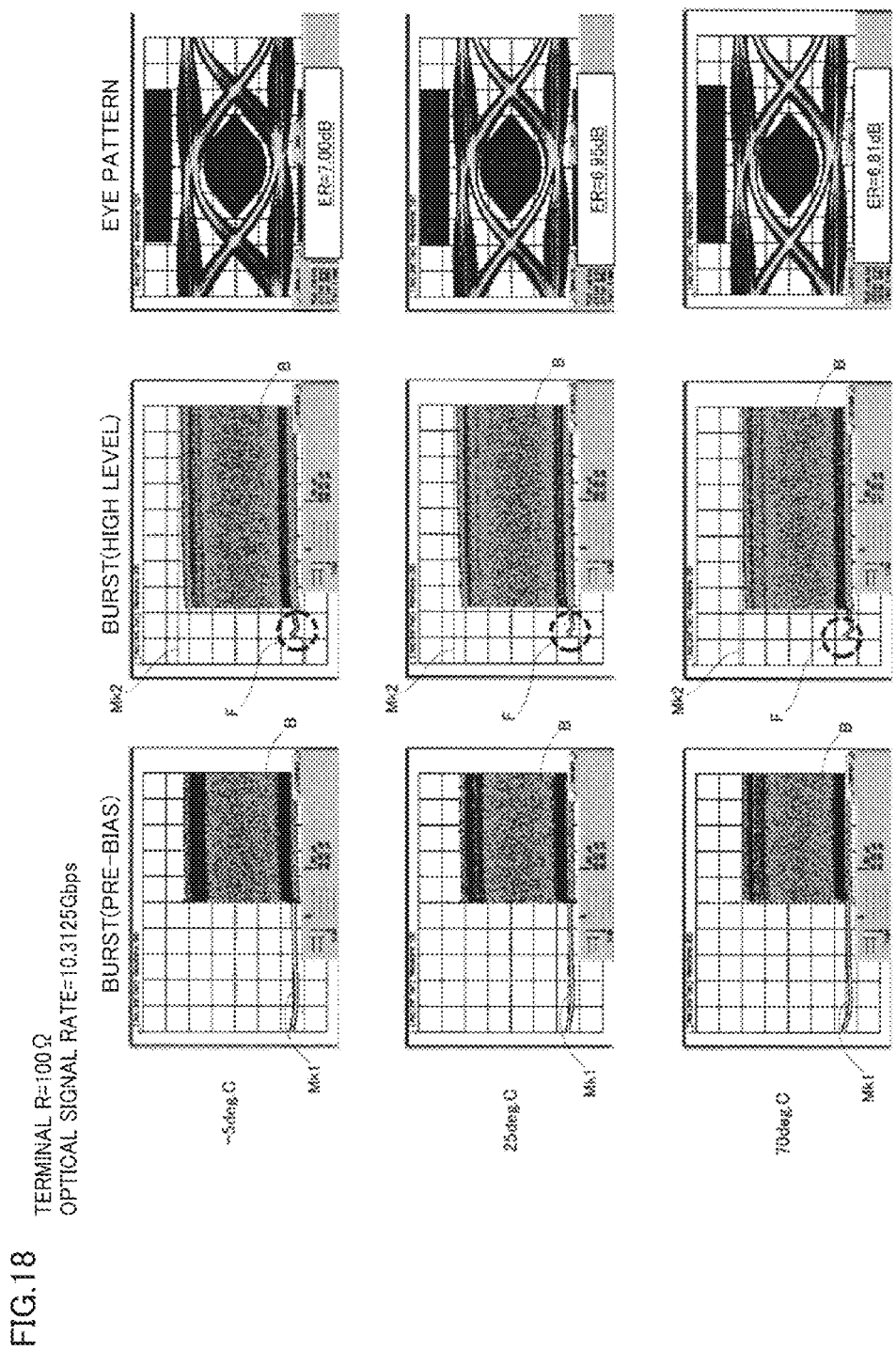
FIG. 18 is a diagram showing a result of measurement of temperature characteristics of an optical signal output from a drive circuit 54.

FIG. 18 is a diagram showing a result of measurement of temperature characteristics of an optical signal output from drive circuit 54. The figure is interpreted similarly to FIG. 12.

FIG. 18 shows that terminal R, that is resistance 20, has a resistance value of 100Ω and a bit rate of an optical signal is set to 10.3125 Gbps.

FIG. 19 is a diagram showing a summary of results of measurement shown in FIGS. 12 to 14 and 18.

Referring to FIGS. 18 and 19, based on the waveform of "burst (pre-bias)" at each temperature, an amount of lowering in level of a burst optical signal in the pre-bias section due to temperature increase is small. Based on the waveform in "eye pattern" at each temperature, an extinction ratio at −5° C. is 7.00 dB, an extinction ratio at 25° C. is 6.95 dB, and an extinction ratio at 70° C. is 6.81 dB. Namely, variation in extinction ratio from −5° C. to 70° C. is as small as −0.19 dB, and improvement as compared to the case shown in FIGS. 12 and 14 can be seen.

As shown in FIG. 18, in drive circuit 54, an eye pattern as in FIGS. 12 and 14 is obtained without a waveform of the eye pattern being lost. Namely, it can be seen that characteristics in transmission of an optical signal comparable to those in drive circuits 51 to 53 shown in FIGS. 6 to 8 are obtained in the drive circuit shown in FIG. 9.

In the burst optical signals shown on an upper side and a lower side of FIG. 17, ringing is greater in rising portions D1 an D2 of the burst optical signals than in the burst optical signal shown in the center in FIG. 17.

In contrast, ringing is less in a rising portion F of the burst optical signal at each of −5° C., 25° C., and 70° C. than in the burst optical signals shown on the upper side and the lower side in FIG. 17, and it can be seen that characteristics in transmission of a burst optical signal has been improved.

In this measurement, at 70° C. shown in FIG. 12 and at 70° C. shown in FIG. 18, currents of 96 mA and 98 mA were consumed in the drive circuits, respectively. Namely, it can be seen that drive circuit 54 shown in FIG. 9 is lower in rate of increase in non-effective current INE and better in terms of power consumption than drive circuit 53 shown in FIG. 8.

In a configuration with a capacitive element being interposed in a line for a burst signal such as a laser drive circuit described in PTD 1, the capacitive element normally has temperature dependency, and hence burst response characteristics have temperature dependency. This temperature dependency may lead to deterioration in characteristics in transmission of an optical signal and may adversely affect communication.

In contrast, in the drive circuit according to the embodiment of the present invention, bias current supply circuit 68 supplies bias current Ibias to light-emitting element LD for transmitting an optical signal. Output buffer circuit 63 supplies to light-emitting element LD, modulated current Imod having magnitude in accordance with a logical value of data to be transmitted. Drive circuit 54 has path 81 through which bias current Ibias flows. Drive circuit 54 has path 82 which includes a path for supplying modulated current Imod to light-emitting element LD from output buffer circuit 63, through which a current returns to bias current supply circuit 68 through output buffer circuit 63 from bias current supply circuit 68 without going through light-emitting element LD when bias current Ibias flows. Drive circuit 54 has path 83 which is joined to path 82 in output buffer circuit 63 and has resistance 20 before a junction, through which a current flows through adjusting resistance 20 to bias current supply circuit 68 when bias current Ibias flows.

According to such a configuration, as compared with a configuration in which only a capacitor is provided in a portion of path 83 before the junction with path 82, temperature dependency of burst response characteristics can be lessened and deterioration in characteristics in transmission of an optical signal can be suppressed. Therefore, with the drive circuit according to the embodiment of the present invention, temperature dependency in a circuit transmitting an optical signal can be suppressed and satisfactory communication can be realized.

In the drive circuit according to the embodiment of the present invention, resistance 20 has such a resistance value that magnitude of the current which flows through path 83 is not lower than 2% and not higher than 70% of magnitude of the current which flows through path 82.

According to such a configuration, even when path 83 is not DC isolated from bias current supply circuit 68, a non-effective current which does not contribute to drive of the light-emitting element, that is, a current which flows between path 83 and bias current supply circuit 68, can be lowered.

In the drive circuit according to the embodiment of the present invention, output buffer circuit 63 includes differential drive circuit 41 switched to allow or not to allow supply of the current to light-emitting element LD in accordance with the logical value of the data and resistance 11 and resistance 12 connected in series between differential outputs of differential drive circuit 41. Path 83 is joined to path 82 between resistance 11 and resistance 12.

Thus, with the configuration including resistance 11 and resistance 12 which are terminal resistances, deterioration in characteristics in transmission in differential drive circuit 41 can be suppressed in particular in transmission of a high-frequency optical signal. In addition, occurrence of ringing due to an unstable potential at a connection node between resistance 11 and resistance 12 can be suppressed.

In the drive circuit according to the embodiment of the present invention, bias current supply circuit 68 starts supply of bias current Ibias when a transmission enable signal for transmitting a burst optical signal is activated.

According to such a configuration, in particular in a circuit which transmits a burst optical signal, to which supply of the bias current is started in response to activation of a transmission enable signal, a behavior of the circuit at the time of start of supply of the bias current can be stabilized.

In the drive circuit according to the embodiment of the present invention, the optical signal has a bit rate higher than 2.5 gigabits/second.

According to such a configuration, in particular in an optical communication system in which an optical signal at a high bit rate higher than 2.5 gigabits/second is transmitted, temperature dependency in a circuit transmitting an optical signal can be suppressed and satisfactory communication can be realized.

Though the drive circuit according to the embodiment of the present invention is configured such that differential drive circuit 41 includes a single transistor circuit, limitation thereto is not intended. Differential drive circuit 41 may include a plurality of stages of transistor circuits. In this case, a DC power supply current should only be supplied from light-emitting circuit 75 to the circuit in the last stage.

It should be understood that the embodiment above is illustrative and non-restrictive in every respect. The scope of the present invention is defined by the terms of the claims, rather than the description above, and is intended to include any modifications within the scope and meaning equivalent to the terms of the claims. The description above includes features additionally described below.

[Additional Aspect 1]

A drive circuit included in an optical network unit adapted to 10G-EPON, comprising:
 a bias current supply circuit for supplying a bias current to a light-emitting element for transmitting an optical signal; and
 a modulated current supply circuit for supplying to the light-emitting element, a modulated current having magnitude in accordance with a logical value of data to be transmitted, and having
 a first path through which the bias current flows,
 a second path which includes a path for supplying the modulated current to the light-emitting element from the modulated current supply circuit, through which a current returns to the bias current supply circuit through the modulated current supply circuit from the bias current supply circuit without going through the light-emitting element when the bias current flows, and
 a third path which is joined to the second path in the modulated current supply circuit and has an adjusting resistance before a junction, through which a current flows through the adjusting resistance to the bias current supply circuit when the bias current flows, and
 the modulated current supply circuit and the light-emitting element being DC coupled to each other.

[Additional Aspect 2]

An optical network unit used in 10G-EPON in a communication system in which optical signals from a plurality of optical network units to an optical line terminal are time division multiplexed, comprising:
 a light-emitting element for transmitting the optical signal; and
 a drive circuit for driving the light-emitting element,
 the drive circuit including
  a bias current supply circuit for supplying a bias current to the light-emitting element, and
  a modulated current supply circuit for supplying to the light-emitting element, a modulated current having magnitude in accordance with a logical value of data to be transmitted, and having
   a first path through which the bias current flows,
   a second path which includes a path for supplying the modulated current to the light-emitting element from the modulated current supply circuit, through which a current returns to the bias current supply circuit through the modulated current supply circuit from the bias current supply circuit without going through the light-emitting element when the bias current flows, and
   a third path which is joined to the second path in the modulated current supply circuit and has an adjusting resistance before a junction, through which a current flows through the adjusting resistance to the bias current supply circuit when the bias current flows, and
   the modulated current supply circuit and the light-emitting element being DC coupled to each other.

REFERENCE SIGNS LIST

11 to 14 resistance; 15, 16 N-type transistor; 17 filter circuit; 19 capacitor; 20 resistance (adjusting resistance); 21 optical transceiver; 22 PON reception processing unit; 23 buffer memory; 24 UN transmission processing unit; 25 UNI port; 26 UN reception processing unit; 27 buffer memory; 28 PON transmission processing unit; 29 control unit; 31, 32 inductor; 33 current source; 41 differential drive circuit; 51 to 53 drive circuit; 61 pre-buffer circuit; 62 equalizer circuit; 63 output buffer circuit (modulated current supply circuit); 64 to 66 power supply; 67 timing circuit; 68 bias current supply circuit; 69 master I/F (interface); 70 CPU; 71 slave I/F; 72 control register; 73 storage unit; 75 light-emitting circuit; 81 to 83 path; 201 optical line terminal; 202A, 202B, 202C, 202D optical network unit; 301 PON system; C1, C2 capacitor; LD light-emitting element; SP1, SP2 splitter; and OPTF optical fiber.

The invention claimed is:

1. A drive circuit, comprising:
   a bias current supply circuit for supplying a bias current to a light-emitting element for transmitting an optical signal;
   a modulated current supply circuit for supplying to the light-emitting element, a modulated current having magnitude in accordance with a logical value of data to be transmitted;
   a first path through which the bias current flows;
   a second path which includes a path for supplying the modulated current to the light-emitting element from the modulated current supply circuit, through which a current returns to the bias current supply circuit through the modulated current supply circuit from the bias current supply circuit without going through the light-emitting element when the bias current flows; and
   a third path which is joined to the second path in the modulated current supply circuit and has an adjusting resistance before a junction, through which a current flows through the adjusting resistance to the bias current supply circuit when the bias current flows.

2. The drive circuit according to claim 1, wherein
   the adjusting resistance has such a resistance value that magnitude of the current which flows through the third path is not lower than 2% and not higher than 70% of magnitude of the current which flows through the second path.

3. The drive circuit according to claim 1, wherein
   the modulated current supply circuit includes
      a differential drive circuit switched to allow or not to allow supply of the current to the light-emitting element in accordance with the logical value of the data, and
      a first terminal resistance and a second terminal resistance connected in series between differential outputs of the differential drive circuit, and
   the third path is joined to the second path between the first terminal resistance and the second terminal resistance.

4. The drive circuit according to claim 1, wherein
   the bias current supply circuit starts supply of the bias current when a transmission enable signal for transmitting a burst optical signal is activated.

5. The drive circuit according to claim 1, wherein
   the optical signal has a bit rate higher than 2.5 gigabits/second.

6. An optical network unit in a communication system in which optical signals from a plurality of optical network units to an optical line terminal are time division multiplexed, comprising:
   a light-emitting element for transmitting the optical signal; and
   a drive circuit for driving the light-emitting element,
   the drive circuit including
      a bias current supply circuit for supplying a bias current to the light-emitting element,
      a modulated current supply circuit for supplying to the light-emitting element, a modulated current having magnitude in accordance with a logical value of data to be transmitted,
      a first path through which the bias current flows,
      a second path which includes a path for supplying the modulated current to the light-emitting element from the modulated current supply circuit, through which a current returns to the bias current supply circuit through the modulated current supply circuit from the bias current supply circuit without going through the light-emitting element when the bias current flows, and
      a third path which is joined to the second path in the modulated current supply circuit and has an adjusting resistance before a junction, through which a current flows through the adjusting resistance to the bias current supply circuit when the bias current flows.

* * * * *